(12) United States Patent
Yamaguchi et al.

(10) Patent No.: US 8,030,651 B2
(45) Date of Patent: Oct. 4, 2011

(54) MICRO ELECTRO MECHANICAL DEVICE AND MANUFACTURING METHOD THEREOF

(75) Inventors: Mayumi Yamaguchi, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 22 days.

(21) Appl. No.: 12/647,704

(22) Filed: Dec. 28, 2009

(65) Prior Publication Data

US 2010/0133537 A1 Jun. 3, 2010

Related U.S. Application Data

(62) Division of application No. 11/777,409, filed on Jul. 13, 2007, now Pat. No. 7,642,114.

(30) Foreign Application Priority Data

Jul. 19, 2006 (JP) .................................. 2006-196403

(51) Int. Cl.
*H01L 29/10* (2006.01)

(52) U.S. Cl. ............ 257/53; 257/67; 257/350; 257/415; 257/E29.003; 257/E29.324

(58) Field of Classification Search .................... 257/53, 257/67, 350, 415, E29.003, E29.324
See application file for complete search history.

(56) References Cited

U.S. PATENT DOCUMENTS

| 6,452,238 B1 | 9/2002 | Orcutt et al. |
| 6,743,656 B2 | 6/2004 | Orcutt et al. |
| 6,860,939 B2 | 3/2005 | Hartzell |
| 7,560,789 B2 | 7/2009 | Izumi et al. |
| 2003/0196590 A1 | 10/2003 | Hartzell |
| 2003/0196591 A1 | 10/2003 | Hartzell |
| 2003/0196592 A1 | 10/2003 | Hartzell |
| 2003/0196593 A1 | 10/2003 | Hartzell |
| 2003/0197214 A1 | 10/2003 | Hartzell |
| 2005/0130360 A1 | 6/2005 | Zhan et al. |
| 2005/0153475 A1 | 7/2005 | Hartzell |
| 2006/0267153 A1 | 11/2006 | Yamaguchi et al. |
| 2006/0270238 A1 | 11/2006 | Izumi et al. |
| 2006/0284183 A1 | 12/2006 | Izumi et al. |
| 2007/0093045 A1 | 4/2007 | Yamaguchi et al. |

FOREIGN PATENT DOCUMENTS

| JP | 2000208018 A | 7/2000 |
| JP | 2001144117 A | 5/2001 |
| JP | 2004001201 A | 1/2004 |
| JP | 2007007845 A | 1/2007 |
| JP | 2007015080 A | 1/2007 |

*Primary Examiner* — Thanh V Pham
*Assistant Examiner* — Marvin Payen
(74) *Attorney, Agent, or Firm* — Fish & Richardson P.C.

(57) ABSTRACT

To manufacture a micro structure and an electric circuit included in a micro electro mechanical device over the same insulating surface in the same step. In the micro electro mechanical device, an electric circuit including a transistor and a micro structure are integrated over a substrate having an insulating surface. The micro structure includes a structural layer having the same stacked-layer structure as a layered product of a gate insulating layer of the transistor and a semiconductor layer provided over the gate insulating layer. That is, the structural layer includes a layer formed of the same insulating film as the gate insulating layer and a layer formed of the same semiconductor film as the semiconductor layer of the transistor. Further, the micro structure is manufactured by using each of conductive layers used for a gate electrode, a source electrode, and a drain electrode of the transistor as a sacrificial layer.

11 Claims, 15 Drawing Sheets

| 11 MICRO STRUCTURE | 10 ELECTRIC CIRCUIT |

21 MICRO STRUCTURE     20 ELECTRIC CIRCUIT

31 MICRO STRUCTURE    10 ELECTRIC CIRCUIT

MICRO ELECTRO MECHANICAL DEVICE AND MANUFACTURING METHOD THEREOF

CROSS-REFERENCE TO RELATED APPLICATIONS

This application is a divisional of U.S. application Ser. No. 11/777,409, filed Jul. 13, 2007, now U.S. Pat. No. 7,642,114, which claims the benefit of a foreign priority application filed in Japan as Serial No. 2006-196403 on Jul. 19, 2006, both of which are incorporated by reference.

BACKGROUND OF THE INVENTION

1. Field of the Present Invention

The present invention relates to a micro electro mechanical device (a micro electronic mechanical system) formed over an insulating substrate. In particular, the present invention relates to a micro mechanical structure of a micro electro mechanical device and a method for manufacturing the micro mechanical structure of the micro electro mechanical device.

2. Description of the Related Art

In recent years, a micro mechanical system called MEMS has been actively researched. MEMS is abbreviation of Micro Electro Mechanical System and translated into a micro electro mechanical device, a micro electro mechanical system, or the like. MEMS is also called a micro machine in Japan and is also called an MST (Micro System Technology) in Europe or the like. In this specification, MEMS is also described as a micromachine or a micro electro mechanical device. MEMS corresponds to an electronic device in which a micro mechanical portion including "a movable micro structure having a three-dimensional structure" is combined with "an electric circuit including a semiconductor element" which controls the mechanical portion. In addition, MEMS is also simply called a micro machine.

Since a MEMS can control its micro structure by an electric circuit, it has been expected that an autonomous-distributed type system can be constructed instead of a central-processing control type system such as a conventional device using a computer. For example, a MEMS can process data obtained by a sensor by using an electric circuit and can drive an actuator or the like in accordance with data processing.

Many researches have been made on a micro machine. For example, an advanced MEMS wafer level package has been proposed to solve a problem that a manufacturing process cannot be used in facilities for wafer manufacturing and plastic assembly in Reference 1 (Japanese Published Patent Application No. 2001-144117). Reference 2 (Japanese Published Patent Application No. 2004-1201) discloses that preferable mechanical characteristics are generated in a layer which forms a structure by controlling laser irradiation.

However, as disclosed in Reference 1, a micro structure which forms a micro machine is manufactured in a manufacturing process of a semiconductor element using a silicon wafer. In particular, in order to obtain a material having thickness and intensity enough for manufacturing of a micro structure, micro machines which are practically used are mainly manufactured by using silicon wafers. In addition, Reference 2 discloses only a cantilever which is a micro structure but dose not disclose integration of the micro structure with an electric circuit at all.

SUMMARY OF THE PRESENT INVENTION

It is an object of the present invention to provide a micro electro mechanical device in which a micro structure and an electric circuit which controls the micro structure are integrated over the same substrate, and a manufacturing method thereof.

A micro electro mechanical device of the present invention includes a micro structure and an electric circuit which controls the micro structure over an insulating surface. The electric circuit is electrically connected to the micro structure and includes a transistor. The micro structure at least includes a structural layer which is not fixed to a substrate and a structural layer part of which is fixed to the substrate. Description "part of a structural layer is fixed to a substrate" corresponds to that the structural layer has a portion which is not fixed to the substrate. That is, the description "part of a structural layer is fixed to a substrate" corresponds to that part of the structural layer is fixed to the substrate so that a space is formed between the substrate and another part of the structural layer. At least one of structural layers which form the micro structure is completely separated from the substrate and a movable range is limited by a structural layer fixed to another substrate. For example, the structural layer which is completely separated from the substrate is used as a rotor and a structural layer serving as a rotation axis of the rotor is formed so as to be fixed to the substrate, so that a movable range of the structural layer serving as the rotor is limited by the structural layer serving as the rotation axis or the like.

In a micro electro mechanical device of the present invention, a micro structure includes a layer with a stacked structure which is the same as a stacked structure of a gate insulating layer and a semiconductor layer of a transistor as first and second structural layers. That is, the micro structure has structural layers including a layer which is formed of the same insulating film as the gate insulating layer and a layer which is formed of the same semiconductor film as the semiconductor layer of the transistor.

As for a micro electro mechanical device in accordance with one aspect of the present invention, a semiconductor layer included in a micro structure has a multi-layer structure and crystalline structures of layers are varied. Therefore, a defect of each layer is compensated so that damage to the micro structure can be suppressed.

As for a micro electro mechanical device in accordance with another aspect of the present invention, a compound of a semiconductor with a metal like a silicide is included in a structural layer of a micro structure. Therefore, intensity of the structural layer can be improved than that of polycrystalline silicon and conductivity can also be improved.

As for a method for manufacturing a micro electro mechanical device in accordance with another aspect of the present invention, a layer formed of the same film as a gate electrode is used for a layer serving as a sacrificial layer in order to provide a movable portion to a micro structure.

In a micro electro mechanical device of the present invention, a micro structure and an electric circuit which controls the micro structure are formed over the same insulating surface, so that mechanical intensity of a connection portion of the electric circuit and the micro structure is high and poor connection is hardly generated. In addition, by a method for manufacturing the micro electro mechanical device of the present invention, a micro electro mechanical device can be provided in which a micro structure and an electric circuit which controls the micro structure are formed over the same insulating surface through the same step. That is, there is no separation of steps such that the micro structure is manufactured after the electric circuit is manufactured or the electric circuit is manufactured after the micro structure is manufactured. Thus, the method for manufacturing is simplified so that the micro electro mechanical device can be manufactured at low cost.

BRIEF DESCRIPTION OF THE DRAWINGS

In the accompanying drawings:

FIG. 1A is a cross-sectional view of the micro electro mechanical device; and FIG. 1B is a top plan view of the micro structure (Embodiment Mode 1);

FIG. 6A is a cross-sectional view of the micro electro mechanical device; and FIG. 6B is a top plan view of the micro structure (Embodiment Mode 2);

FIG. 10A is a cross-sectional view of the micro electro mechanical device; and FIG. 10B is a top plan view of a micro structure (Embodiment Mode 3);

DETAILED DESCRIPTION OF THE INVENTION

Figure 1A:
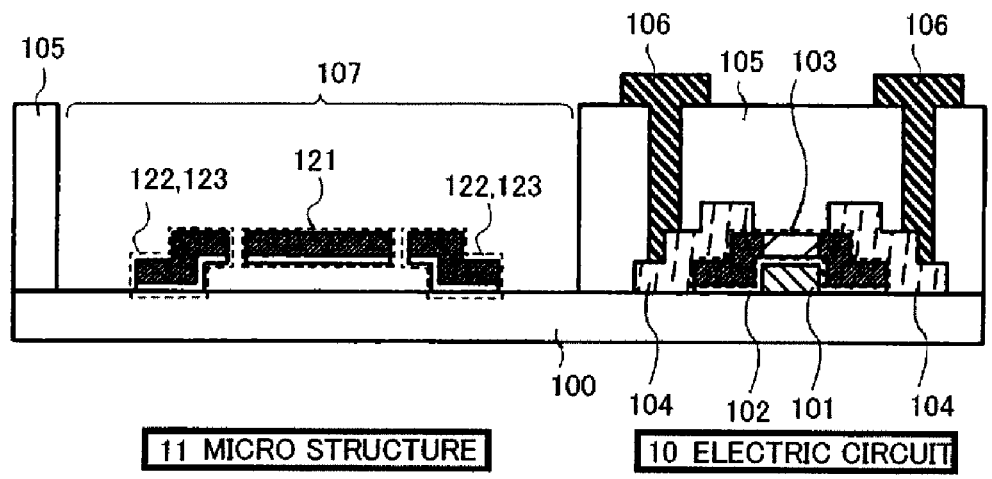
FIGS. 1A and 1B illustrate a structural example of a micro electro mechanical device of the present invention.

Hereinafter, embodiment modes of the present invention are described with reference to the accompanying drawings. However, the present invention is not limited to description to be given below. Unless changes and modifications depart from the spirit and the scope of the present invention, they should be construed as being included therein. Therefore, the present invention should not be construed as being limited to the description of the embodiment modes and embodiment.

Note that elements having the same reference numerals denote the same elements among different embodiment modes and repetitive description thereof is omitted.

Embodiment Mode 1

Figure 1B:
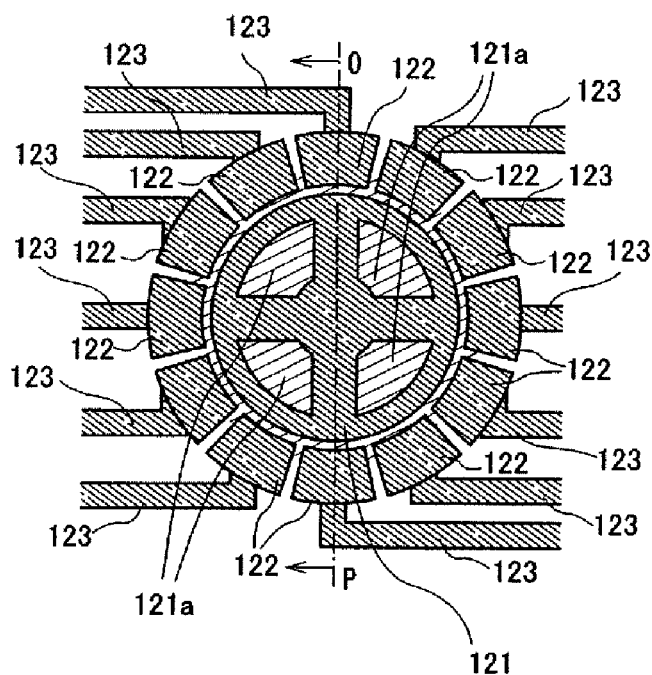

In this embodiment mode, a method for manufacturing a micro structure and an electric circuit which controls the micro structure over the same substrate and at the same time is described. FIGS. 1A and 1B illustrate a structure of a MEMS of this embodiment mode; FIG. 1A is a cross-sectional view of the MEMS; and FIG. 1B is a top plan view of the micro structure. A cross-sectional view taken along a dash-dot line O-P in FIG. 1B corresponds to the cross-sectional view of a micro structure 11 in FIG. 1A. Note that in FIG. 1A, the left side is the cross-sectional view of a first region in which the micro structure is formed and the right side is the cross-sectional view of a second region in which the electric circuit is formed. This point is similar to cross-sectional views shown in FIGS. 2A to 3B. In addition, in FIG. 1A, a cross-sectional structure of an electric circuit 10 of the second region typically shows a transistor and other embodiment modes are also similar in this respect.

The electric circuit 10 and the micro structure 11 are provided over the same substrate 100 having an insulating surface. A transistor of the electric circuit 10 is a thin film transistor and a structure thereof is a bottom-gate structure. The transistor includes a first conductive layer 101, a first insulating layer 102 over the first conductive layer 101, a semiconductor layer 103 over the first insulating layer 102, and second conductive layers 104 over the semiconductor layer 103.

The first conductive layer 101 forms a gate electrode or a gate wiring of the transistor. The first insulating layer 102 forms a gate insulating layer. At least a channel formation region and a high-concentration impurity region functioning as a source region or a drain region are formed in the semiconductor layer 103. The second conductive layers 104 are connected to the high-concentration impurity region of the semiconductor layer 103 and functions as a source electrode or a drain electrode.

A second insulating layer 105 is formed so as to cover the transistor. Third conductive layers 106 are formed over the second conductive layer 105. The third conductive layers 106 are connected to the second conductive layers 104 through a contact hole formed in the second insulating layer 105.

An electrode, a wiring, and a terminal of the electric circuit 10 are formed by using the first conductive layer 101, the second conductive layers 104, and the third conductive layers 106. The micro structure 11 and the electric circuit 10 are electrically connected by the electrode and the wiring formed by using the first conductive layer 101, the second conductive layers 104, and the third conductive layers 106. An element other than the transistor is also formed in the electric circuit 10. For example, a MIS-type capacitor or a diode can be formed by using the semiconductor layer 103.

As shown in FIG. 1A, the micro structure 11 is formed in an opening portion 107 formed in the second insulating layer 105. The micro structure 11 includes a movable electrode 121 (a first structural layer), twelve fixed electrodes 122 (second structural layers) fixed to the substrate 100, and wirings 123 connected to the fixed electrodes 122. The movable electrode 121 is a so-called rotor and the fixed electrode 122 is a so-called stator. Each of the wirings 123 is connected to the electric circuit 10. Each of the wirings 123 and each of the fixed electrodes 122 are integrated. That is, part of each of the wirings 123 forms each of the fixed electrodes 122. Therefore, each of the fixed electrodes 122 and each of the wirings 123 can be collectively considered as the second structural layer.

The movable electrode 121 is discoid. The movable electrode 121 is provided with four opening portions 121a and is separated from the substrate 100.

The twelve fixed electrodes 122 are circularly provided so as to surround the movable electrode 121. Although the fixed electrodes 122 are fixed to the substrate 100, leading edges (edges which are close to the movable electrode 121) thereof are separated from the substrate 100 and electrostatic force can be set to operate on the movable electrode 121 in a position separated from the substrate.

Each of the movable electrode 121, the fixed electrodes 122, and the wirings 123 has a multi-layer structure. A lower layer thereof is formed of an insulating layer and an upper layer thereof is formed of a conductive layer. The insulating layer of the lower layer is formed of the same insulating film and in the same layer as the first insulating layer 102. The conductive layer of the upper layer is formed of the same semiconductor film and in the same layer as the semiconductor layer 103 of the transistor.

The micro structure 11 can function as a three-phase quadruple motor by connecting the twelve fixed electrodes 122 in parallel every three fixed electrodes by using the wirings 123. Electrostatic force (electrostatic attraction) is generated between the movable electrode 121 and each of the fixed electrodes 122 by sequentially applying voltage to each of the three-phase fixed electrode 122. The movable electrode 121 is rotated by this electrostatic force. A rotation direction of the movable electrode 121 can be controlled by the voltage applied to each of the fixed electrodes 122.

Figure 2A:
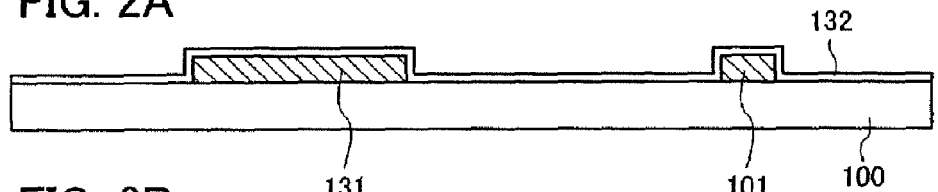
FIGS. 2A to 2E are cross-sectional views showing a method for manufacturing a micro electro mechanical device of the present invention (Embodiment Mode 1)
Figure 2B:
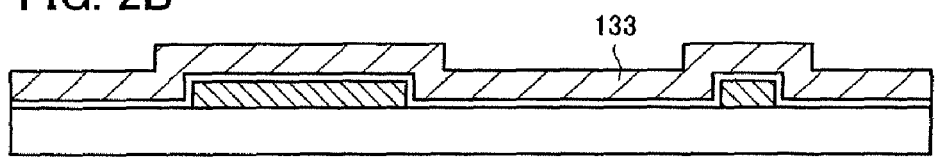

Hereinafter, a method for manufacturing the MEMS shown in FIGS. 1A and 1B is described with reference to FIGS. 2A to 5. Here, the micro structure 11 is formed in the first region and the electric circuit 10 is formed in the second region. First, a substrate having an insulating surface is prepared as the substrate 100. A conductive film is formed over the substrate 100 and is processed into predetermined shapes by a photolithography process and an etching process, so that the first conductive layer 101 and a first conductive layer 131 are formed as shown in FIG. 2A. That is, the first conductive layer 101 and the first conductive layer 131 are formed by patterning the conductive film (Processing a film into predetermined shapes by a photolithography process and an etching process is also called patterning). A first insulating layer 132 is formed over the first conductive layers 101 and 131.

As the substrate having the insulating surface, an insulating substrate such as a glass substrate, a quartz substrate, or a plastic substrate, or an insulating substrate in which an insulating film is formed over a surface can be used. In addition, a conductive substrate of a silicon wafer, metal, stainless steel, or the like in which an insulating film is formed over a surface can also be used.

The insulating film which is formed over the surface of the substrate can be formed of a single-layer film or a multi-layer film of a material selected from silicon oxide, silicon nitride, silicon oxynitride ($SiO_xN_y$, x>y), silicon nitride oxide ($SiO_xN_y$, x<y), and the like. These films can be formed by CVD or sputtering. In the case of a silicon wafer or a metal substrate, nitride or oxide can also be formed by nitriding or oxidizing a surface thereof.

As a material of each of the first conductive layers 101 and 131, a metal such as molybdenum (Mo), tungsten (W), chromium (Cr), tantalum (Ta), titanium (Ti), or aluminum (Al), a metal compound which includes any of these metal elements as a main component (e.g., titanium nitride or tungsten nitride), an alloy which includes any of these metal elements as a main component (e.g., an alloy of aluminum and titanium or an alloy of chromium and molybdenum), or the like can be selected. These materials can be formed by vapor deposition or sputtering, and each of the first conductive layers 101 and 131 is formed of a single-layer film or a multi-layer film of these materials.

Figure 4:
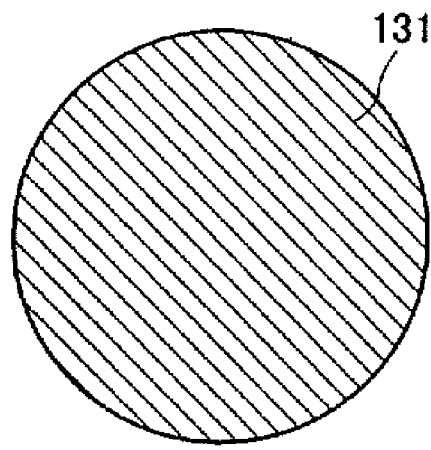
FIG. 4 is a top plan view of a micro structure which is in the middle of manufacturing and is a top plan view of a first conductive layer (a first sacrificial layer) (Embodiment Mode 1)

The conductive layer 131 is a layer serving as a sacrificial layer, and shapes of the structural layers (the movable electrode 121, the fixed electrodes 122, and the wirings 123) of the micro structure 11 are defined by a shape of the first conductive layer 131. The first conductive layer 131 is formed to be discoid as shown in FIG. 4. An electrode, a wiring, a terminal, or the like which forms the electric circuit 10 can be formed in the electric circuit 10 by the first conductive layer 101 as well as the gate electrode (the gate wiring).

In order to form a gate insulating film of the transistor, a material which is suitable for the gate insulating film is selected as the first insulating layer 132. For example, the first insulating layer 132 can be formed of a single-layer film or a multi-layer film of a material selected from silicon oxide, silicon nitride, silicon oxynitride ($SiO_xN_y$, x>y), silicon nitride oxide ($SiO_xN_y$, x<y), and the like.

Next, a semiconductor layer 133 is formed over the first insulating layer 132. The semiconductor layer 133 can be formed of silicon, germanium, or a compound of silicon and germanium (silicon germanium). In addition, the semiconductor layer 133 is formed of a crystalline semiconductor in this embodiment mode. An amorphous semiconductor is formed by CVD or sputtering and an amorphous semiconductor film is crystallized by light energy or thermal energy, so that a crystalline semiconductor film can be formed. Further, a microcrystalline semiconductor or a polycrystalline semiconductor can also be formed by CVD or sputtering. In the later case, crystallization (or improvement in crystallinity) can also be performed by light energy or thermal energy after the formation.

For example, in order to form amorphous silicon, it is only necessary to form amorphous silicon by CVD by using a source gas in which silane ($SiH_4$) gas is diluted by adding hydrogen. Alternatively, amorphous silicon can be formed by sputtering by using a target formed of silicon. In order to form amorphous germanium, amorphous germanium can be formed by CVD by using a source gas in which germane ($GeH_4$) gas is diluted by adding hydrogen or can be formed by sputtering by using a target formed of germanium. In order to form amorphous silicon germanium, amorphous silicon germanium can be formed by CVD by using a source gas in which silane ($SiH_4$) gas and germane ($GeH_4$) gas are mixed at a predetermined ratio and are diluted by adding hydrogen or can be formed by sputtering by using two kinds of targets formed of silicon and germanium.

Helium gas, fluorine gas, or a rare gas such as Ar, Kr, or Ne can be added to a source gas as well as hydrogen gas for formation by CVD. In addition, $Si_2H_6$, $SiH_2Cl_2$, $SiHCl_3$, $SiCl_4$, $SiF_4$, or the like can be used as a source gas instead of monosilane ($SiH_4$). Further, a microcrystalline semiconductor or a polycrystalline semiconductor can be directly formed on the first insulating layer 132 by plasma CVD by using the above-described source gas. Furthermore, a microcrystalline semiconductor or a polycrystalline semiconductor can be formed by controlling substrate temperature or the like by using the above-described target.

As a crystallizing method of the amorphous semiconductor film, irradiation with laser light, irradiation with infrared rays or the like, heating in an electric furnace, introduction of a metal element which promotes crystallization of a semiconductor into a semiconductor film, or the like can be given.

As a laser which is used for crystallization, both a continuous wave laser (a CW laser) and a pulsed laser can be used. As a gas laser which is suitable for crystallization, an Ar laser, a Kr laser, an excimer laser, or the like is given. As a solid-state laser, a laser using a crystal such as YAG, $YVO_4$, $YAlO_3$, $GdVO_4$, or forsterite ($Mg_2SiO_4$) which includes a dopant (e.g., Nd, Yb, Cr, Ti, Ho, Er, Tm, or Ta) as a medium, a glass laser, a ruby laser, an alexandrite laser, a Ti:sapphire laser, or the like can be given.

For crystallization of the semiconductor, not only irradiation with a fundamental wave of a beam emitted from such a laser but also irradiation with a beam of a second harmonic wave to a fourth harmonic wave of the fundamental wave can be performed. For example, a second harmonic wave (532 nm) or a third harmonic wave (355 nm) of an $Nd:YVO_4$ laser (having a fundamental wave of 1064 nm) can be used. Energy density of the laser is necessary to be set in a range of greater than or equal to 0.01 $MW/cm^2$ and less than or equal to 100 $MW/cm^2$, and preferably, energy density thereof is set in a range of greater than or equal to 0.1 $MW/cm^2$ and less than or equal to 10 $MW/cm^2$. It is only necessary to set scan speed in a range of greater than or equal to 10 cm/sec and less than or equal to 200 cm/sec.

Note that a solid-state laser using the above-described crystal such as YAG as a medium, an Ar ion laser, and a Ti:sapphire laser can be continuously oscillated, and can also be pulsed oscillated with a repetition rate of 10 MHz or more by performing a Q-switch operation, mode locking, or the like. When a laser beam is emitted with a repetition rate of 10 MHz or more, a semiconductor film can be irradiated with the next pulse during the period in which the semiconductor film is melted by the laser beam and solidified. Therefore, a solid-fluid interface generated by performing irradiation with the laser beam can be continuously moved by scanning the laser beam, so that crystal grains of the semiconductor can be grown long in the scan direction.

Alternatively, the semiconductor film can be crystallized by performing irradiation with infrared light, visible light, or ultraviolet light which uses a lamp as a light source instead of the laser beam. As the lamp, a halogen lamp, a metal halide lamp, a xenon arc lamp, a carbon arc lamp, a high pressure sodium lamp, or high pressure mercury lamp is typically used. Irradiation with light by the lamp is repeated 1 to 10 times, preferably, 2 to 6 times. The lamp is turned on for 1 to 60 seconds, preferably, 30 to 60 seconds for one irradiation, and a semiconductor film is to be heated at a temperature of 600° C. to 1000° C. for a moment.

In the case of using an electric furnace for heat treatment, it is preferable that a heating process at around 400° C. be performed first to release hydrogen in silicon, and then, temperature be raised to temperature to crystallize amorphous silicon when the semiconductor is amorphous silicon in which silane is used as source gas. By performing such heat treatment, roughness of the film in crystallization can be suppressed.

As a formation method of the crystalline semiconductor, there is a method of performing crystallization using a metal element which promotes crystallization. This method is particularly preferable for crystallizing an amorphous silicon film. A metal element which promotes crystallization of the amorphous silicon film is introduced into a semiconductor and irradiation with a laser beam or heat treatment by an electric furnace at a temperature of 500° C. to 600° C. is performed, so that a crystalline semiconductor having high continuity of a crystal grain in a grain boundary can be obtained. As a metal element which promotes crystallization of silicon, one or a plurality of metal elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used. In addition, crystallization using the metal element can be applied not only to amorphous silicon but also to amorphous silicon germanium including germanium at around 0.01 to 4.5 atomic %.

A means for introducing such a metal element into the semiconductor is not particularly limited as long as it is a method in which the metal element can be over a surface of the semiconductor or inside of the semiconductor. For example, sputtering, CVD, plasma treatment (including plasma CVD), an adsorption method, or a method of applying a solution of metal salt can be used. Among them, the method of using a solution is easy and can easily adjust concentration of the metal element which is introduced into the semiconductor. In order to spread the solution over the entire surface of the semiconductor for applying the solution, it is preferable to improve wettability of the surface of the semiconductor. In order to improve wettability thereof, it is preferable to form an extremely thin oxide film having a thickness of 10 nm or less over the surface of the semiconductor. Such an extremely thin oxide film can be formed by performing irradiation with UV light in an oxygen atmosphere, thermal oxidation, treatment using hydrogen peroxide, treatment using ozone water including hydroxyl radical, or the like.

As for crystalline silicon which is crystallized by using the metal element, the bond of elements of silicon in a crystal grain boundary is continued without breakage, similarly to single-crystalline silicon. Because of a characteristic of such a crystal structure, toughness of crystalline silicon becomes higher than that of polycrystalline silicon which is manufactured by performing crystallization without using a metal element. This is because stress concentration caused by a defect of the crystal grain boundary does not occur so that fracture toughness of crystalline silicon becomes higher than that of polycrystalline silicon which is manufactured by performing crystallization without using the metal element. In addition, since electron mobility is high because the bond of atoms in the crystal grain boundary is continued, crystalline silicon is suitable for a material of a structural layer of a micro structure which is controlled by electrostatic force (electrostatic attraction). Needless to say, such crystalline silicon can be applied to a micro structure which is controlled by electromagnetic force.

In addition, silicide is formed by connecting the metal element such as nickel used for crystallization to silicon. It is known that a metal compound such as nickel silicide has higher intensity than that of silicon. Therefore, the metal element may be introduced so that silicide is formed in the structural layer.

On the other hand, since the metal element used for crystallization deteriorates element characteristics of the electric circuit 10, it is preferable to remove the introduced metal element after crystallization from the semiconductor layer 133 in the region (the second region) where the electric circuit 10 is at least formed. A method thereof is described below.

First, a barrier layer formed of an oxide film (called chemical oxide) is formed having a thickness of 1 nm to 10 nm over a surface of the crystalline semiconductor film by processing the surface of crystalline silicon with a solution including ozone (typically, ozone water). The barrier layer functions as an etching stopper when only a gettering layer is selectively removed in a later step.

Subsequently, the gettering layer including a rare gas element is formed over the barrier layer as a gettering site. Here, a semiconductor film including a rare gas element is formed as the gettering layer by CVD or sputtering. When the gettering layer is formed, a sputtering condition is adjusted appropriately so that the rare gas element is added to the gettering layer. As the rare gas element, one or a plurality of elements selected from helium (He), neon (Ne), argon (Ar), krypton (Kr), and xenon (Xe) can be used. Note that since a metal element tends to move to a region having high oxygen concentration in gettering, it is preferable that concentration of oxygen included in the gettering layer be, for example, $5 \times 10^{18}$ cm$^{-3}$ or more.

Next, the metal element is removed from crystalline silicon by performing heat treatment (e.g., heat treatment by an electric furnace or irradiation with a laser beam) to the crystalline silicon film, the barrier layer, and the gettering layer, so that concentration of the metal element in the crystalline silicon film can be decreased.

Figure 2C:
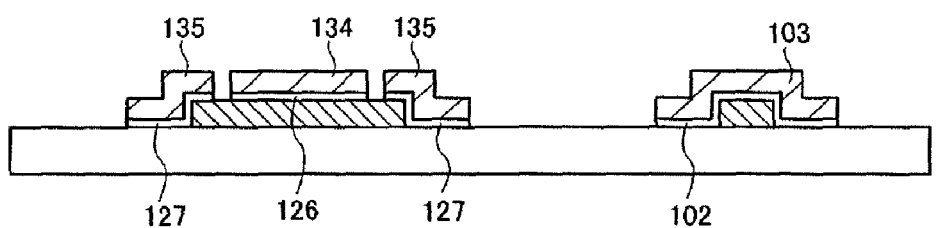
Figure 5:
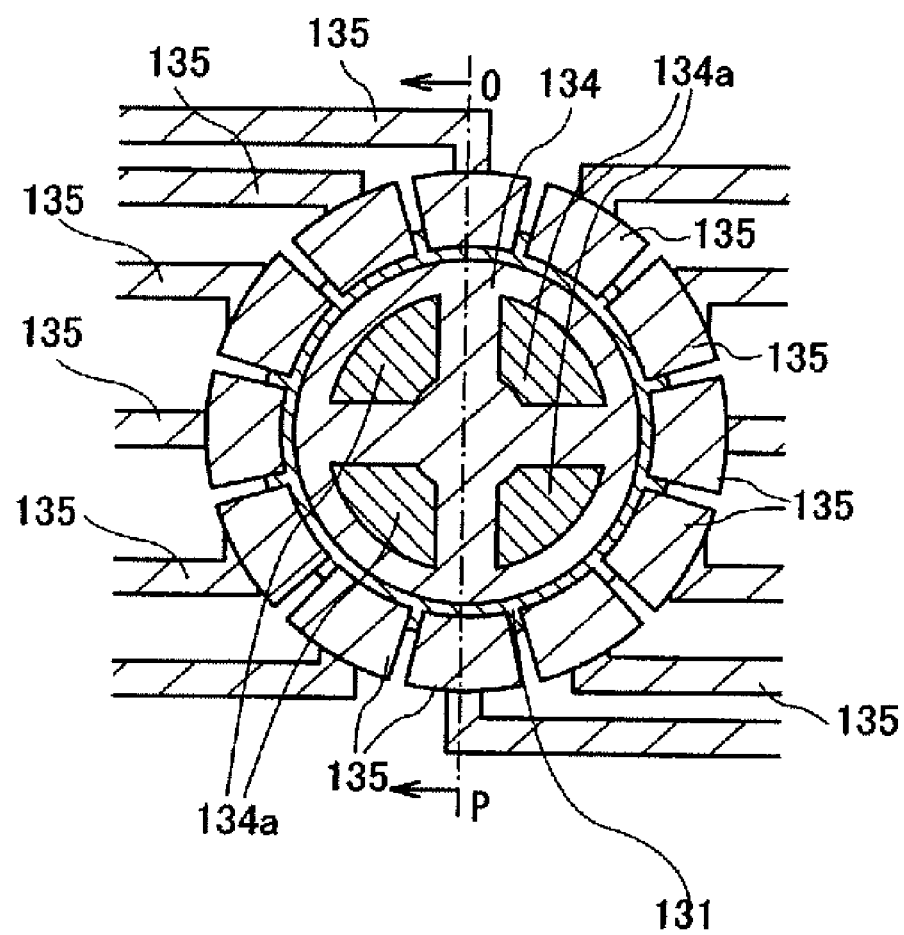
FIG. 5 is a top plan view of a micro structure which is in the middle of manufacturing and is a top plan view of the micro structure shown in FIG. 2C (Embodiment Mode 1)

Next, as shown in FIG. 2C, a photolithography process and an etching process are performed to the semiconductor layer 133 and the first insulating layer 132 to be processed into predetermined shapes. The semiconductor layer 103 of the transistor, a semiconductor layer 134 serving as part of the first structural layer, and a semiconductor layer 135 serving as part of the second structural layer are formed from the semiconductor layer 133. In addition, the first insulating layer 132 is processed into the same shape as each of the semiconductor layers 103, 134, and 135; the first insulating layer 102 serving as the gate insulating film of the transistor is formed in the second region; and an insulating layer 126 serving as part of the first structural layer and an insulating layer 127 serving as part of the second structural layer are formed in the first region. FIG. 5 is a top plan view of the micro structure 11 in FIG. 2C. A cross section taken along a dash-dot line O-P in FIG. 5 is shown in FIG. 2C.

By this step, shapes of the first and second structural layers of the micro structure 11 are determined. A layered product of the insulating layer 126 and the semiconductor layer 134, which is formed circularly, forms the movable electrode 121, and a layered product of the insulating layer 127 and the semiconductor layer 135 forms the fixed electrode 122 and the wiring 123. Note that the movable electrode 121 is the first structural layer which is not fixed to the substrate 100 and is finally separated from the substrate 100. Therefore, all of the layered product of the insulating layer 126 and the semiconductor layer 134 is provided over a top surface of the first conductive layer 131 serving as the sacrificial layer. In addition, as shown in FIG. 5, the first structural layer which is formed circularly may include opening portions 134a. The fixed electrode 122 is the second structural layer including a portion which is separated from the substrate 100 on edge and a portion which is fixed to the substrate 100. In order to form such a fixed electrode 122, an edge of the layered product of the insulating layer 127 and the semiconductor layer 135 is formed so as to cover the top surface and a side surface of the first conductive layer 131, and other parts of the layered product of the insulating layer 127 and the semiconductor layer 135 are formed so as to be in contact with the surface (the insulating surface) of the substrate 100.

Figure 2D:
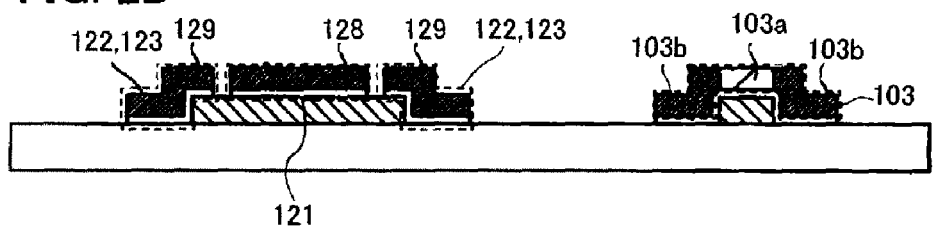

Next, as shown in FIG. 2D, in order to form an n-type or p-type high concentration impurity region, an impurity which imparts conductivity is selectively added to the semiconductor layer 103 by doping or ion implantation. Phosphorus (P) or arsenic (As) is used as the impurity element which imparts n-type conductivity and boron (B) is used as the impurity element which imparts p-type conductivity. In order to add the impurity to portions except for a portion over the first conductive layer 101 serving as the gate electrode, it is only necessary to add the impurity by covering a region to which the impurity is not added with a resist mask by using photolithography. By this step, high concentration impurity regions 103b are formed in the semiconductor layer 103 and the region over the first conductive layer 101 to which the impurity is not added is determined as a channel formation region 103a.

In addition, in the first region, an impurity is similarly added to the semiconductor layer 134 which forms the first structural layer and the semiconductor layer 135 which forms the second structural layer to impart conductivity, so that conductive layers 128 and 129 are formed. Thus, the first structural layer can function as the movable electrode 121 and the second structural layer can function as the fixed electrode 122 and the wiring 123.

Figure 2E:
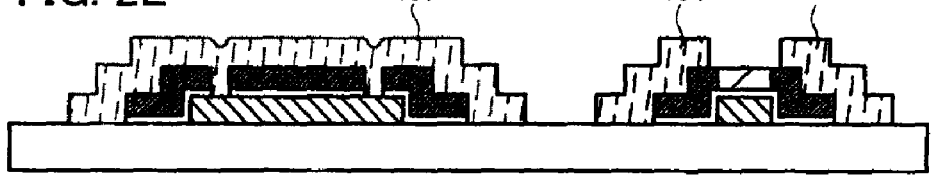

Next, a conductive film is formed by sputtering or the like and is processed by a photolithography process and an etching process, so that the second conductive layers 104 are formed in the second region and a second conductive layer 137 is formed in the micro structure 11 as shown in FIG. 2E. An electrode, a wiring, a terminal, or the like which forms the electric circuit 10 by the second conductive layers 104 is formed in the second region as well as an electrode (a wiring) which is connected to the high concentration impurity regions 103b.

The second conductive layer 137 is formed in the first region to protect the first and second structural layers from being removed by etching when an opening portion 107 is formed in the second insulating layer 105, which is described below. In addition, since the second conductive layer 137 is finally removed, it is also a sacrificial layer (a second sacrificial layer). The second conductive layer 137 covers at least a portion of the structural layers (126 to 129) in which the opening portion 107 is formed. Needless to say, there may be a portion in which a portion of a region, where the second insulating layer 105 is left, is covered in the structural layers (126 to 129). In this case, the wirings 123 of the micro structure 11 partially include a stacked-layer structure of the insulating layer 127, the conductive layer 129, and the second conductive layer 137.

In addition, the same materials as the first conductive layers 101 and 131 can be selected as materials of the second conductive layers 104 and 137, and the second conductive layers 104 and 137 are formed of a single-layer film or a multi-layer film of these materials. Note that since the second conductive layer 137 is formed so as to cover the conductive layers 128 and 129 which are formed of semiconductors, it is preferable to use a material including an metal element which can form a metal compound by reacting with silicon or germanium as the second conductive layer 137. As such a metal element, a refractory metal such as tungsten, titanium, molybdenum, or tantalum, cobalt, nickel, or the like can be given.

In this case, the second conductive layer 137 reacts with a metal element by performing heat treatment after the second conductive layer 137 is formed, so that the conductive layers 128 and 129 can be layers which are formed of metal compounds. If the conductive layers 128 and 129 are formed of silicon, they can be silicide layers. The conductive layers 128 and 129 are formed to be metal compounds such as silicide, so that both conductivity and intensity can be improved. Alternatively, the conductive layers 128 and 129 can partially be formed of metal compounds. As heat treatment for forming the metal compounds, heat treatment by an electric furnace or irradiation with a laser beam or lamp light can be used.

In the case where necessary electric conductivity can be obtained by forming the conductive layers 128 and 129 to be the metal compounds such as silicide, it is not necessary to add the n-type or p-type impurity to the semiconductor layers 134 and 135 in the step in FIG. 2D.

Figure 3A:
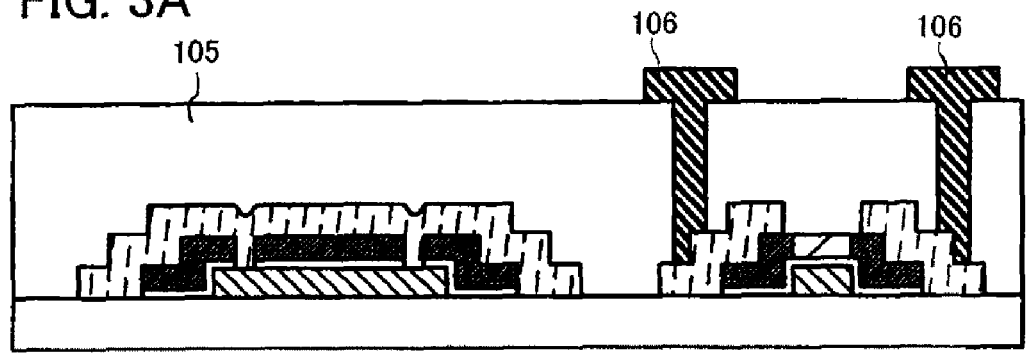
FIGS. 3A and 3B are cross-sectional views showing a manufacturing method of a micro electro mechanical device of the present invention (Embodiment Mode 1)

Next, as shown in FIG. 3A, the second insulating layer 105 is formed. In the second region, a conductive film is formed over the second conductive layers 104 after a contact hole is formed in the second insulating layer 105, and this conductive film is processed into a predetermined shape by a photolithography process and an etching process to form the third conductive layers 106 in the electric circuit 10. A wiring or the like other than a wiring connected to the transistor is also formed in the electric circuit 10 by the third conductive layers 106.

The second insulating layer 105 is an interlayer insulating film which separates the third conductive layers 106 from the second conductive layers 104 between the layers and can also function as a sealing layer which seals the electric circuit 10. As the second insulating layer 105, an inorganic insulating film of silicon oxide, silicon nitride, silicon oxynitride ($SiO_xN_y$, x>y), silicon nitride oxide ($SiO_xN_y$, x<y), or the like can be used. Alternatively, an organic resin film of polyimide, acryl, or the like or a film including siloxane may be used. An organic resin may be any of a photosensitive resin and a non-photosensitive resin. The second insulating layer 105 can be formed of a single-layer structure or a multi-layer structure of these insulating materials. For example, a first layer can be an inorganic insulating film formed of silicon nitride and a second layer can be an organic resin film formed of polyimide or the like. Note that siloxane is a material which has a skeletal structure with the bond of silicon (Si) and oxygen (O), and as a substituent, an organic group (e.g., an alkyl group or an aryl group) is used. As the substituent, a fluoro group may also be used.

The third conductive layers 106 can be formed similarly to the first conductive layers 101 and 131 or the second conductive layers 104 and 137. Note that since the first conductive layer 131 and the second conductive layer 137 are removed by etching, it is necessary to select a material which cannot be removed by an etching agent which removes the first conductive layer 131 and the second conductive layer 137 as the third conductive layers 106.

Figure 3B:
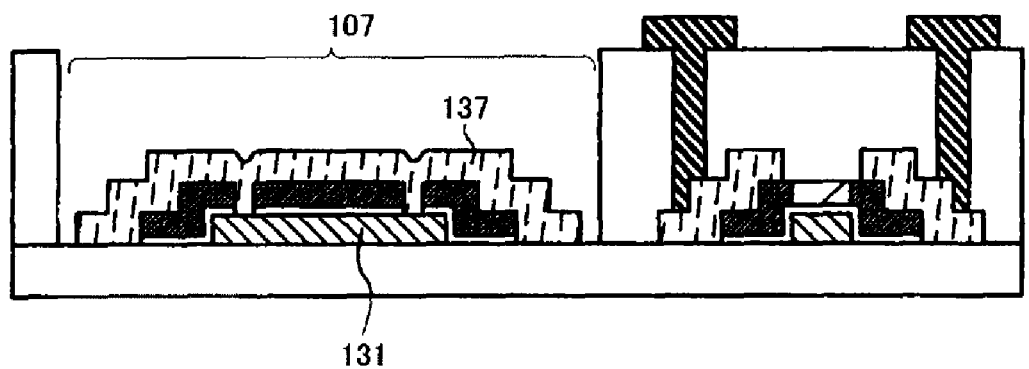

After the third conductive layers 106 are formed, the opening portion 107 is formed in a region of the second insulating layer 105 in 11 is formed by etching as shown in FIG. 3B to expose the second conductive layer 137. At this time, since the micro structure 11 is protected by the second conductive layer 137, a layer which is formed by using a material having a low etching selection ratio to the second insulating layer 105 may be formed in the micro structure 11. For example, the same material as the second insulating layer 105 may be used as the first insulating layers 126 and 127. In addition, the first structural layer which is the movable electrode 121 is not fixed to anywhere of the substrate 100 when sacrificial layer etching is performed. If sacrificial layer etching is performed in such a condition, there is a possibility that the first structural layer disappear. In order to prevent this, it is preferable that the opening portion 107 be provided over not all of the first region but part of the first region. For example, the opening portion 107 is formed in the same position as the opening portions 134a provided in the semiconductor layer 134 serving as the first structural layer shown in FIG. 1 or is formed to be slightly wider than the opening portions 134a.

Next, the second conductive layer 137 (the second sacrificial layer) and the first conductive layer 131 (the first sacrificial layer) are removed by etching, that is, so-called sacrificial layer etching is performed. When sacrificial layer etching is terminated, the micro structure 11 shown in FIG. 1A is completed. The opening portions 121a formed in the movable electrode 121 are provided so that an etching agent spreads over the first sacrificial layer 131 when sacrificial layer etching is performed. Any of wet etching and dry etching can be used for an etching method of the second conductive layer 137 and the first conductive layer 131, and a suitable etching agent is selected depending on the material which forms the layers.

For example, when the first conductive layer 131 and the second conductive layer 137 (the sacrificial layers) are formed of tungsten (W), a solution in which 28% ammonia and 31% hydrogen peroxide water are mixed in a ratio of one to two can be used as the etching agent. When these sacrificial layers are formed of aluminum, mixed acid of nitric acid and phosphoric acid can be used as the etching agent.

In addition, depending on the material of the sacrificial layers, sacrificial layer etching can also be performed by dry etching using a gas of $F_2$ or $XeF_2$ in a condition of high pressure such as atmospheric pressure.

Note that in order to prevent buckling of the micro structure by a capillary phenomenon in drying after wet etching, it is preferable to perform rinsing by using an organic solvent having low viscosity (e.g., cyclohexane), drying in a condition of low temperature and low pressure, or treatment in which these are combined.

In this manner, in the present invention, the micro structure having the rotor and the electric circuit can be formed over the same substrate having the insulating surface. Therefore, mechanical intensity of a connection portion of the electric circuit and the micro structure is high so that poor connection is hardly generated. In addition, since there is no step of integrating the micro structure and the electric circuit later, manufacturing cost can be reduced.

Embodiment Mode 2

Figure 6A:
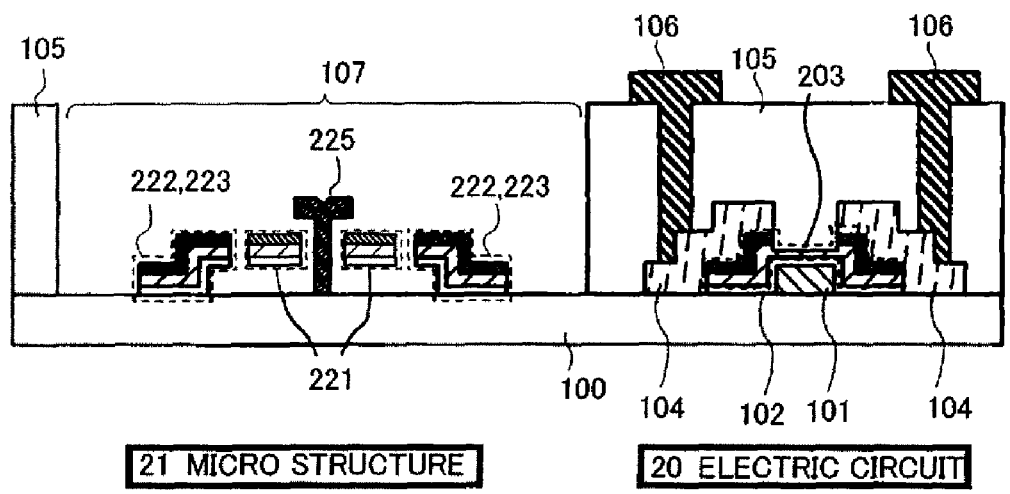
FIGS. 6A and 6B illustrate a structural example of a micro electro mechanical device of the present invention.
Figure 6B:
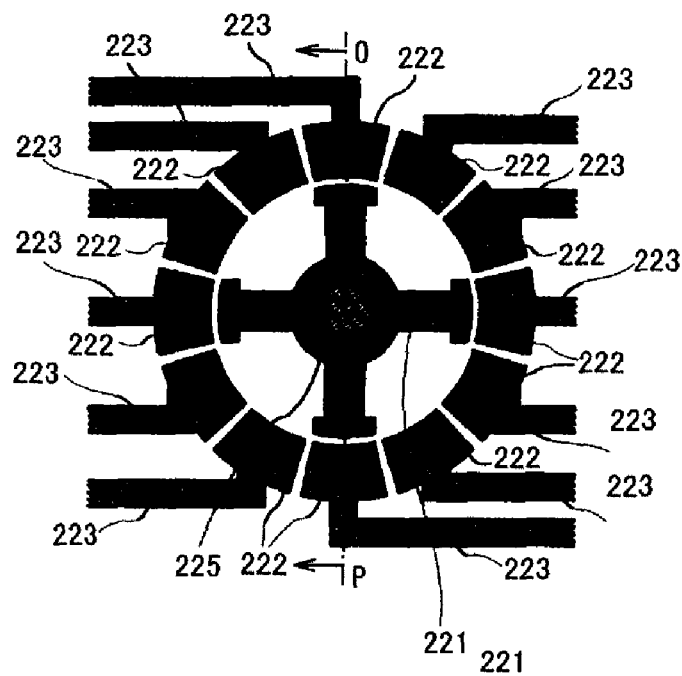

In this embodiment mode, a method for manufacturing a micro structure and an electric circuit which controls the micro structure over the same substrate and at the same time is described. FIGS. 6A and 6B illustrate a structure of a MEMS of this embodiment mode; FIG. 6A is a cross-sectional view of the MEMS; and FIG. 6B is a top plan view of the micro structure. Note that in FIG. 6A, the left side is the cross-sectional view of a first region in which the micro structure is formed and the right side is the cross-sectional view of a second region in which the electric circuit is formed. Cross-sectional views shown in FIGS. 7A to 8C are also similar in this respect.

In the MEMS of this embodiment mode, an electric circuit 20 and a micro structure 21 are also provided over the same substrate 100. Although a transistor of the electric circuit 20 is a bottom gate thin film transistor, which is common to Embodiment Mode 1, a structure of a semiconductor layer 203 is different from that of Embodiment Mode 1. Although the micro structure 21 includes a rotor and a stator, which is common to Embodiment Mode 1, the micro structure 21 includes a rotation axis (a third structural layer), which is different from Embodiment Mode 1. A structure of the MEMS of this embodiment mode is specifically described with reference to FIGS. 6A and 6B.

The electric circuit 20 and the micro structure 21 are provided over the same substrate 100 (over the same insulating surface). The thin film transistor of the electric circuit 20 includes the first conductive layer 101 which forms a gate electrode or a gate wiring of the transistor, the first insulating layer 102 which is provided over the first conductive layer 101 and forms a gate insulating layer, the semiconductor layer 203 over the first insulating film 102, and the second conductive layers 104 over the semiconductor layer 203.

The semiconductor layer 203 is a two-layer structure and includes a semiconductor layer in which a channel formation region is formed and a semiconductor layer (a conductive layer) which have n-type or p-type conductivity, which is stacked over the semiconductor layer and functions as a source region or a drain region (a high concentration impurity region). Hereinafter, the former is described as a first semiconductor layer and the latter is described as a second semiconductor layer. The second conductive layers 104 are formed over the second semiconductor layer of the semiconductor layer 203, are connected to the second semiconductor layer, and each function as a source electrode or a drain electrode.

The second insulating layer 105 is also formed in the electric circuit 20 so as to cover the second conductive layers 104, the semiconductor layer 203, the first insulating layer 102, and the first conductive layer 101. The third conductive layers 106 are formed over the second conductive layer 105. The third conductive layers 106 are connected to the second conductive layers 104 through a contact hole formed in the second insulating layer 105.

An electrode, a wiring, and a terminal of the electric circuit 20 are formed by using the first conductive layer 101, the second conductive layers 104, and the third conductive layers 106. An element other than the transistor is also formed in the electric circuit 20. For example, a capacitor can be formed by using an n-type semiconductor layer of the semiconductor layer 203, the first insulating layer 102, and the first conductive layer 101.

As shown in FIG. 6B, the micro structure 21 includes a movable electrode 221 (a first structural layer), twelve fixed electrodes 222 (second structural layers) fixed to the substrate 100, wirings 223 connected to the fixed electrodes 222, and a rotation axis 225 (a third structural layer) which is fitted into a center of the movable electrode 221. The movable electrode 221 is a so-called rotor and the fixed electrode 222 is a so-called stator. The movable electrode 221 rotates around the rotation axis 225 by electrostatic attraction generated between the movable electrode 221 and the fixed electrode 222 by sequentially applying voltage to the three-phase fixed electrodes 222. A rotation direction of the movable electrode 221 can be controlled by voltage applied to the fixed electrodes 222.

The fixed electrodes 222 and the wirings 223 have the same structures as the fixed electrodes 122 and the wirings 123 of Embodiment Mode 1, respectively except that a stacked-layer structure of the structural layer which forms the electrode and the wiring is different, and each of the fixed electrodes 222 and each of the wirings 223 are integrated. Each of the fixed electrodes 222 and each of the wirings 223 can be collectively considered as the second structural layer.

The movable electrode 221 has a structure in which four T-shaped (a shape in which width of an edge is widened) layers are symmetrically formed around a disk. In addition, seeing from a top surface, an appearance of the movable electrode 221 is a cross shape and circumference of the movable electrode 221 is an arc-shaped.

Each of the movable electrode 221, the fixed electrodes 222, and the wirings 223 has a multi-layer structure. A lower layer thereof is formed of an insulating layer and an upper layer thereof is formed of a semiconductor layer. The insulating layer of the lower layer is formed of the same insulating film and in the same layer as the first insulating layer 102. The semiconductor layer of the upper layer has the same two-layer structure of the first semiconductor layer and the second semiconductor layer (the conductive layer) as the semiconductor layer 203, and is formed of the same semiconductor film and in the same layer as the semiconductor layer 203 of the transistor.

The rotation axis 225 is fixed to the substrate 100 through an opening portion which is formed in a central portion of the movable electrode 221. In addition, an edge of the rotation axis 225 is formed to be larger than the opening portion of the movable electrode 221 and is formed so that the movable electrode 221 does not come out. Note that it is not necessary to provide the rotation axis 225 in the central of the movable electrode 221. In the case where the micro structure 21 is to be used as the rotor, the rotation axis 255 can be provided in other than the central.

Hereinafter, a method for manufacturing the MEMS shown in FIGS. 6A and 6B is described with reference to FIGS. 7A to 9. Note that description which overlaps with Embodiment Mode 1 is omitted and the description of Embodiment Mode 1 is employed.

Figure 7A:
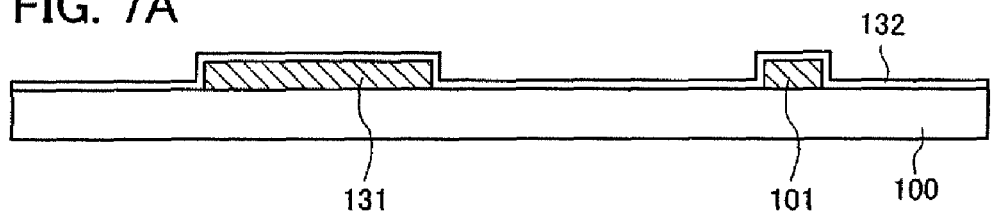
FIGS. 7A to 7E are cross-sectional views showing a method for manufacturing a micro electro mechanical device of the present invention (Embodiment Mode 2)

First, similarly to Embodiment Mode 1, a substrate having an insulating surface is prepared as the substrate 100. Conductive films are formed over the substrate 100 and are processed into predetermined shapes by a photolithography process and an etching process, so that the first conductive layers 101 and 131 are formed as shown in FIG. 7A. The first insulating layer 132 is formed over the first conductive layers 101 and 131.

Another electrode, wiring, or terminal is formed by the first conductive layer 101 in the electric circuit 20 as well as the gate wiring of the transistor. The first conductive layer 131 formed in the micro structure 21 functions as a sacrificial layer and is processed into a discoid shape as shown in FIG. 4, similarly to Embodiment Mode 1.

Figure 7B:
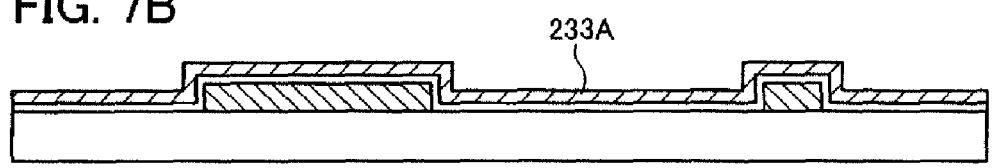

Next, the semiconductor layer which forms the movable electrode 221, the fixed electrodes 222, and the wirings 223 is formed in the first region and the semiconductor layer which forms the semiconductor layer 203 of the transistor is formed in the second region. First, as shown in FIG. 7B, a semiconductor film 233A which forms the first semiconductor layer is formed. Since the semiconductor film 233A forms the channel formation region of the transistor, the semiconductor film 233A is formed intentionally without being added with an impurity which imparts conductivity so that the semiconductor film 233A becomes an intrinsic semiconductor (an i-type semiconductor). The semiconductor film 233A may be any of an amorphous semiconductor and a crystalline semiconductor such as a micro crystalline semiconductor or a polycrystalline semiconductor. As a method of forming the semiconductor film 233A, the method described in Embodiment Mode 1 can be used.

Figure 7C:
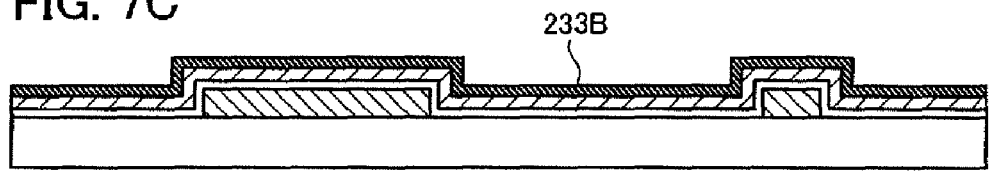

Next, as shown in FIG. 7C, a semiconductor film 233B which forms the second semiconductor layer is formed. Since the semiconductor film 233B forms the source region and the drain region of the transistor, the semiconductor film 233B is a semiconductor layer including an impurity which imparts n-type or p-type conductivity and also functions as a conductive layer. The semiconductor film 233B may also be any of an amorphous semiconductor and a crystalline semiconductor such as a micro crystalline semiconductor or a polycrystalline semiconductor. As a method of forming the semiconductor film 233B, the method described in Embodiment Mode 1 can be used.

Since a semiconductor layer having a two-layer structure of the semiconductor film 233A and the semiconductor film 233B is used as the structural layer in this embodiment mode, the structural layer can be formed of a semiconductor layer of two layers which have different crystalline structures. A characteristic such as intensity is varied depending on crystalline structures, a defect of the crystalline structure of each layer can be compensated by forming the structural layer using a multi-layer film of semiconductors having different crystalline structures.

For example, the semiconductor film 233A can be formed of an amorphous semiconductor and the semiconductor film 233B can be formed of a polycrystalline semiconductor. Alternatively, the semiconductor film 233A can be formed of a polycrystalline semiconductor and the semiconductor film 233B can be formed of an amorphous semiconductor.

Needles to say, the semiconductor film 233A and the semiconductor film 233B may have the same crystalline structure. By forming each of the semiconductor layers with a multi-layer structure, it becomes easy to form the structural layer thickly. For example, formation of an amorphous semiconductor film and crystallization by performing heat treatment using thermal energy or light energy are repetitively performed, so that a stacked-layer film in which crystalline semiconductor films are stacked can be formed. Since the stacked-layer film of crystalline semiconductors can be formed in this manner and internal stress of a lower layer can be relieved by performing heat treatment of a crystallization step of an upper layer, peeling of the film and transformation of the substrate can be prevented.

In addition, in the case where crystalline semiconductors are used as the semiconductor film 233A and the semiconductor film 233B, the semiconductor film 233A and the semiconductor film 233B can be stacked so that crystalline growth directions thereof are varied. For example, in the case of crystallizing the semiconductor films using a metal element, crystalline growth of the semiconductors develops in a vertical direction to the substrate when the metal element is added to the entire surface of regions to be crystallized. On the other hand, in the case of selectively adding a metal element and performing laser irradiation or heat treatment, crystalline growth of the semiconductors develops in a parallel direction to the substrate.

By stacking layers having different crystalline growth directions, a structural layer having excellent toughness can be formed. Since the layers having the different crystalline growth directions are stacked, a defect of each layer can be compensated. That is, a crack is hardly spread over the layer having the different crystalline growth direction even when the crack is generated in a crystal grain boundary of one layer, so that breaking of the structural layer can be suppressed.

In addition, the semiconductor films 233A and 233B can be crystallized by selecting a region which is crystallized. That is, the semiconductor films 233A and 233B can be crystallized by selecting only the region (the second region) in which the electric circuit 20 is formed or selecting only the region (the first region) in which the micro structure 21 is formed. For example, the semiconductor film 233A is formed of an amorphous semiconductor and only the region to be the micro structure 21 is crystallized. The semiconductor film 233B is formed of a micro crystalline semiconductor and partial crystallization is not performed. In this case, the first semiconductor layer of the micro structure 21 and the first semiconductor layer of the transistor have different crystalline structures even when they are formed in the same layer, and the second semiconductor layers of the micro structure 21 and the transistor have the same crystalline structure.

Note that selective crystallization is achieved by selectively irradiating the semiconductors with a laser beam. In addition, in the case of performing crystallization using the metal element, a region to which the metal element is added is formed partially.

Figure 7D:
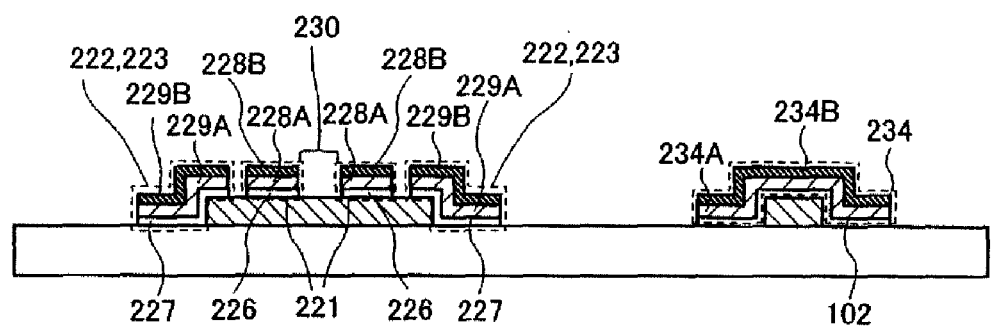

After the semiconductor films 233A and 233B are formed, the semiconductor films 233A and 233B, and the first insulating layer 132 are processed into predetermined shapes by a photolithography process and an etching process as shown in FIG. 7D.

First semiconductor layers 234A, 228A, and 229A are formed from the semiconductor film 233A. Semiconductor layers 234B, 228B, and 229B are formed from the semiconductor film 233B. In addition, the first insulating layer 132 is removed except for portions which overlap with the semiconductor layers 234A, 234B, 228A, 228B, 229A, and 229B by an etching process, and the first insulating layer 102, and first insulating layers 226 and 227 are formed in the second region and the first region, respectively.

Figure 9:
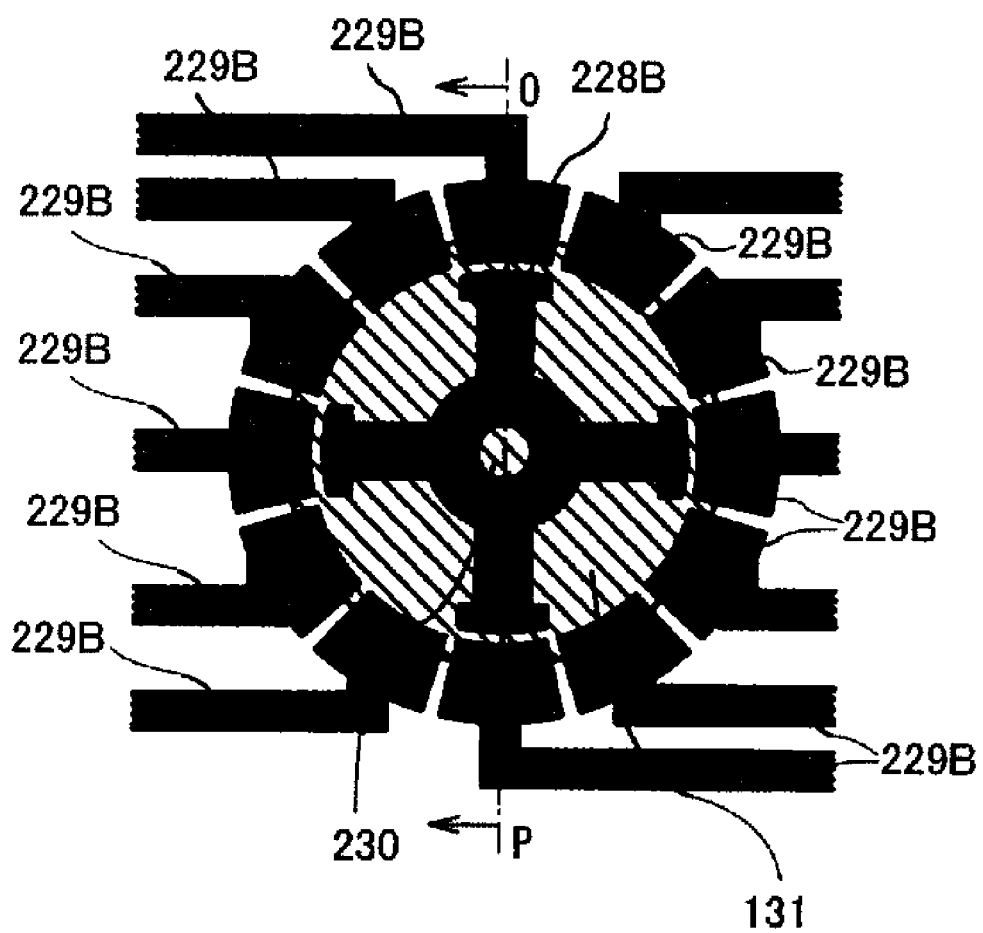
FIG. 9 is a top plan view of a micro structure which is in the middle of manufacturing and is a top plan view of a first conductive layer (a first sacrificial layer) (Embodiment Mode 2)

By this step, shapes of the movable electrode 221, the fixed electrodes 222, and the wirings 223 of the micro structure 21 are determined. FIG. 9 is a top plan view of the micro structure 21 in FIG. 7D. A cross section taken along a dash-dot line O-P in FIG. 9 is shown in FIG. 7D.

A layered product of the insulating layer 226, the first semiconductor layer 228A, and the second semiconductor layer 228B is the structural layer (the first structural layer) which forms the movable electrode 221, and is provided with an opening portion 230 for forming the rotation axis 225 in the center. A layered product of the first insulating layer 227, the first semiconductor layer 229A, and the second semiconductor layer 229B is the structural layer (the second structural layer) which forms the fixed electrodes 222 and the wirings 223.

The first insulating layer 102 serving as the gate insulating film and a semiconductor layer 234 which forms the semiconductor layer 203 are formed in the second region. The semiconductor layer 234 is formed of a stacked-layer film of the first semiconductor layer 234A and the second semiconductor layer 234B.

Figure 7E:
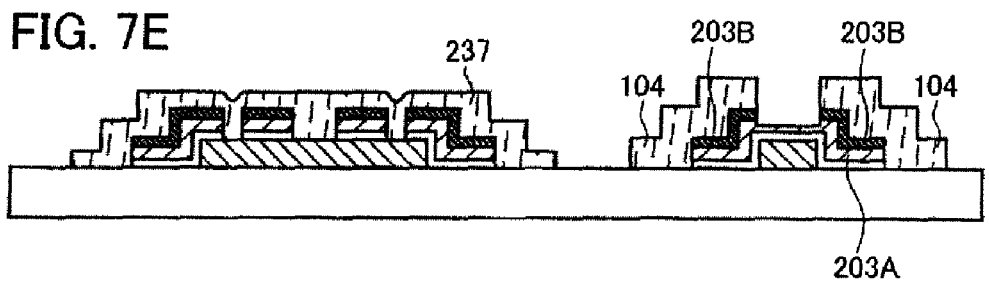

Next, a conductive film is formed by sputtering or the like and is processed by a photolithography process and an etching process, so that the second conductive layers 104 are formed in the second region and a second conductive layer 237 is formed in the micro structure 21 as shown in FIG. 7E. An electrode, a wiring, a terminal and the like which form the electric circuit 20 by the second conductive layers 104 are formed in the second region as well as an electrode (a wiring) of the transistor. In addition, the conductive film which forms the second conductive layers 104 and 237 can be formed similarly to Embodiment Mode 1.

The second conductive layer 237 is formed to protect the structural layers from being removed by etching when the opening portion 107 is formed in the second insulating layer 105, which is described below. In addition, since the second conductive layer 237 is finally removed, it is also a sacrificial layer (a second sacrificial layer). The second conductive layer 237 covers at least surfaces of the structural layers (the first semiconductor layers 228A and 229A, the second semiconductor layers 228B and 229B, and the insulating layers 226 and 227) in which the opening portion 107 is formed. Needless to say, there may be a portion which covers the structural layers (the first semiconductor layer 229A, the second semiconductor layer 229B, and the insulating layer 227) in which the second insulating layer 105 is left. In this case, the wirings 223 of the micro structure 21 partially include a stacked-layer structure of the insulating layer 227, the first semiconductor layer 229A, the second semiconductor layer 229B, and the second conductive layer 237.

The semiconductor layer 234 is partially removed by etching using the second conductive layers 102 as masks, so that the semiconductor layer 203 is formed in the second region. The second semiconductor layer 234B is divided by this etching and a pair of second semiconductor layers 203B is formed. The pair of the second semiconductor layers 203B functions as a source region and a drain region. An outer layer of the first semiconductor layer 234A is partially removed and a first semiconductor layer 203A in which a channel formation region is formed is formed.

Oh the other hand, the second conductive layer 237 is formed of metal which can form a metal compound by reacting with silicon or germanium, so that the first semiconductor layers 228A and 229A, and the second semiconductor layers 228B and 229B are reacted with the second conductive layer 237 by performing heat treatment similarly to Embodiment Mode 1; thus, a metal compound (typically, silicide which is a compound of metal and silicon) can be formed in the first region. In this case, formation of the metal compound by heat treatment or the like is performed after the semiconductor layer 234 is etched.

In this case, all of the second semiconductor layers 228B and 229B can be formed of the metal compound. Alternatively, outer layers of the second semiconductor layers 228B and 229B can be partially formed of the metal compound. The second semiconductor layers 228B and 229B are conductive layers having n-type or p-type conductivity and intensity as well as electric conductivity thereof can be improved by forming the second semiconductor layers 228B and 229B to be the metal compound.

In addition, all of the first semiconductor layers 228A and 229A can be formed of the metal compound depending on thickness of the second semiconductor layers 228B and 229B. Certain thickness of sides which are in contact with the second conductive layer 237 can be at least formed of a metal compound. That is, sides of the movable electrode 221 and the fixed electrode 222 or inside of the opening portion 230 in which the rotation axis is provided later can be formed of the metal compound. Forming such portions which are easily damaged to be the metal compounds is extremely effective for improvement in intensity of the micro structure.

Further, since the first semiconductor layers 228A and 229A do not particularly have conductivity because of formation of the channel formation region of the transistor, resistance in the movable electrode 221, the fixed electrodes 222, and the wirings 223 can be lowered by forming the metal compound. In particular, since the metal compound is formed over a surface in which the fixed electrodes 222 are opposed to the movable electrode 221, an area of a portion where electrostatic force can be generated can be widened.

Note that electric conductivity of the first semiconductor layers 228A and 229A is improved, so that the first semiconductor layers 228A and 229A can be conductive layers. For example, it is only necessary to form an n-type or p-type impurity region by selectively adding an impurity which imparts n-type or p-type conductivity to a portion in the first region of the first semiconductor layer 233A before the second semiconductor layer 233B is formed (see FIG. 7B). Such a region is selectively formed of a metal compound (e.g., silicide or a compound of germanium and metal), so that the first semiconductor layers 228A and 229A can also be the conductive layers. Alternatively, both addition of the impurity and formation of the metal compound can also be performed.

Figure 8A:
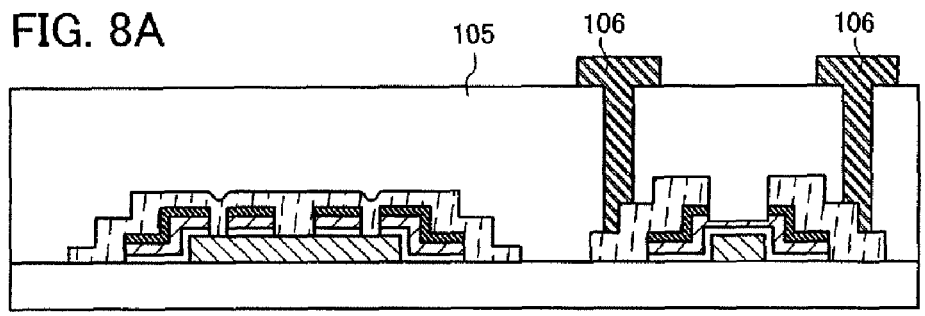
FIGS. 8A to 8C are cross-sectional views showing a method for manufacturing a micro electro mechanical device of the present invention (Embodiment Mode 2)
Figure 8B:
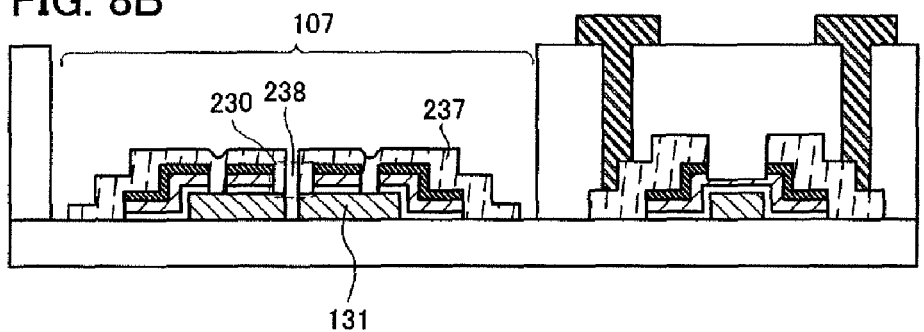

Next, as shown in FIG. 8A, the second insulating layer 105 is formed. A conductive film is formed over the second conductive layers 104 after a contact hole is formed in the second insulating layer 105, and the conductive film is processed into a predetermined shape by a photolithography process and an etching process to form the third conductive layers 106 in the electric circuit 20. As shown in FIG. 8B, the opening portion 107 is formed in a region in which the micro structure 21 of the second insulating layer 105 is formed by etching to expose the second conductive layer 237.

Next, as shown in FIG. 8B, an opening portion 238 which penetrates the second conductive layer 237 and the first conductive layer 131 is formed in a portion in which the rotation axis 225 is formed. The opening portion 238 can be formed by dry etching and the second conductive layer 237 and the first conductive layer 131 are formed by anisotropic etching.

The opening portion 238 is formed inside of the opening portion 230 of the movable electrode 221. In order to separate the rotation axis 225 from the movable electrode 221, the opening portion 238 is formed to be smaller than the opening portion 230 which is provided in the movable electrode 221 shown in FIG. 7D so that the second conductive layer 237 is left in the opening portion 230.

Figure 8C:
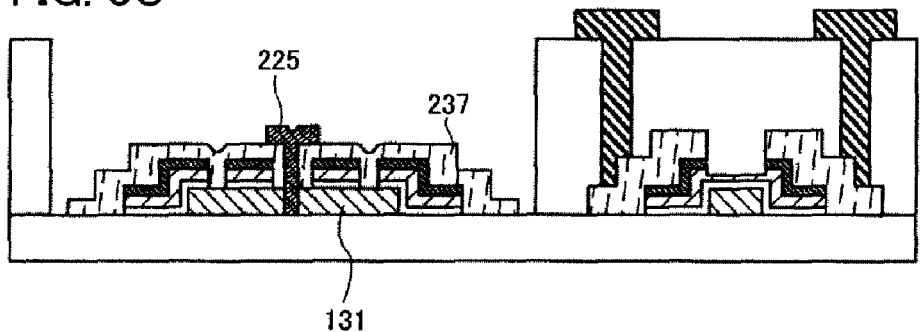

A film formed of a polycrystalline semiconductor, metal, a metal compound, an alloy, or the like is formed over the second conductive layer 237 and is processed into a predetermined shape by a photolithography process and an etching process to form the rotation axis 225 as shown in FIG. 8C. A material which cannot be removed by an etching agent used for sacrificial layer etching which removes the first conductive layer 131 and the second conductive layer 237 is used as a material of the rotation axis 225.

The edge (the portion over the second conductive layer 237) of the rotation axis 225 is processed to be wider than the opening portion 230 and a bottom of the rotation axis is formed so as to adhere to the substrate 100.

Next, the second conductive layer 237 (the second sacrificial layer) and the first conductive layer 131 (the first sacrificial layer) are removed by etching, that is, so-called sacrificial layer etching is performed. When sacrificial layer etching is terminated, the micro structure 11 shown in FIG. 6A is completed.

In this manner, in the present invention, the micro structure having the rotor and the electric circuit can be formed over the same substrate having the insulating surface. Therefore, mechanical intensity of a connection portion of the electric circuit and the micro structure is high so that poor connection is hardly generated. In addition, since there is no step of integrating the micro structure and the electric circuit later, manufacturing cost can be reduced.

Embodiment Mode 3

Figure 10A:
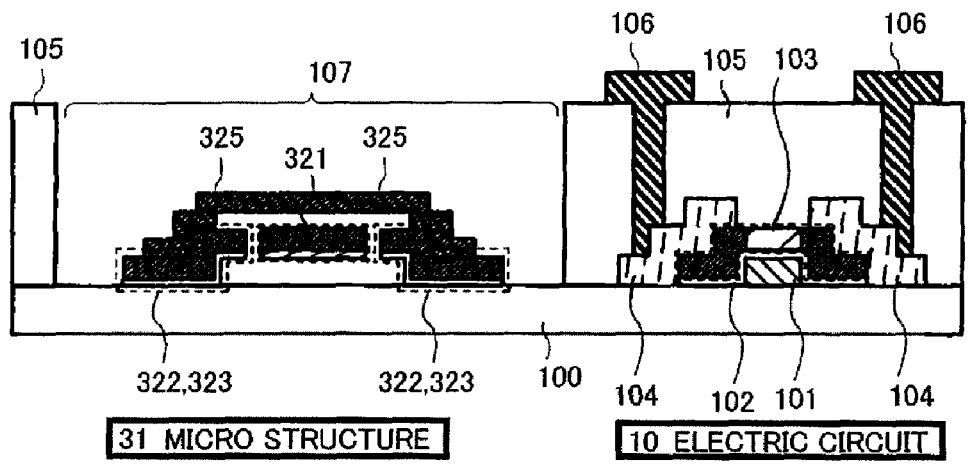
FIGS. 10A and 10B illustrate a structural example of a micro electro mechanical device of the present invention.
Figure 10B:
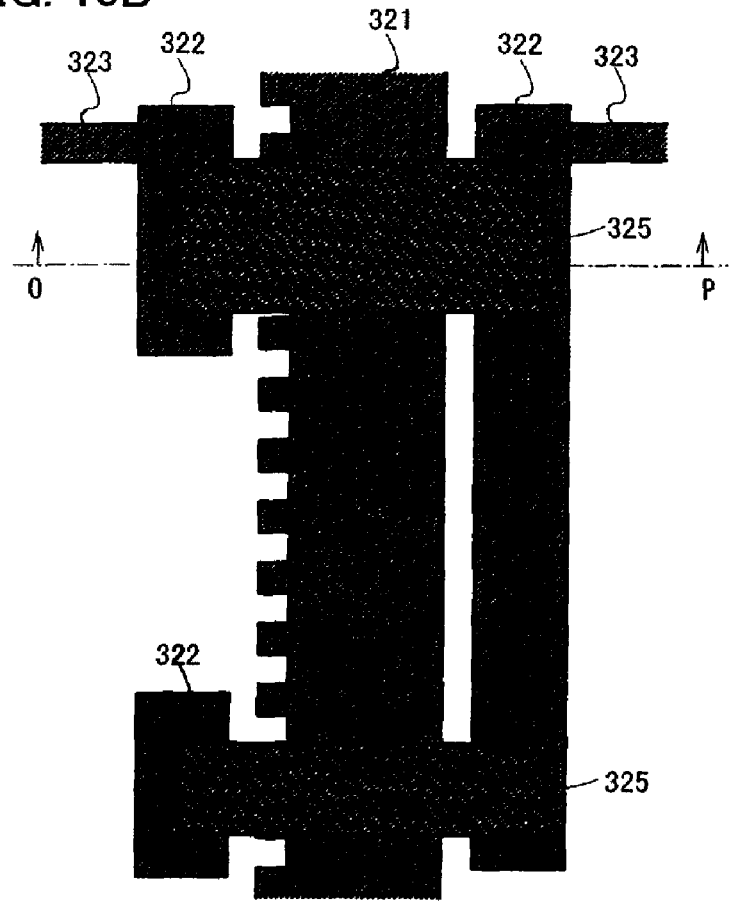
Figure 14:
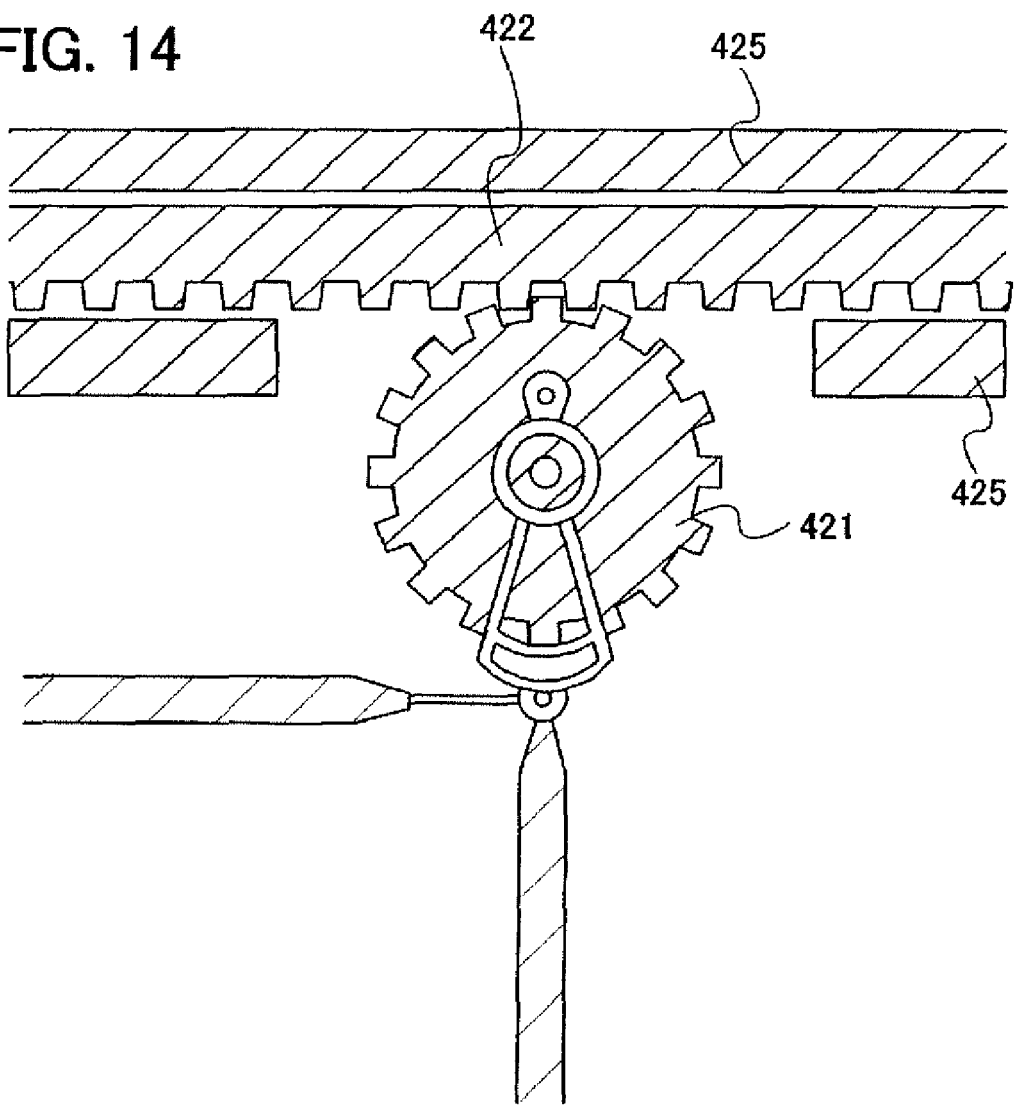
FIG. 14 is an external perspective view of a micro structure of the present invention (Embodiment Mode 4)

In this embodiment mode, an example is described in which the micro structure is transformed in the MEMS of Embodiment Mode 1. In this embodiment mode, a micro structure includes a mobile part (a slider) which is a comb-shape and long and fixed parts on opposite sides and moves in a direction which is horizontal to the substrate. Such a micro structure changes a certain mechanical movement into another movement, for example, it changes a rotational movement into a linear movement. Specifically, as shown in FIG. 14, a comb of a mobile part 422 (a slider) engages with a cog of a gear 421 so that the gear 421 which rotates moves the mobile part 422. The mobile part 422 moves linearly in its longitudinal direction. In addition, fixed parts 425 are provided on opposite ends of the mobile part 422 and limits the mobile part to move in directions other than the longitudinal direction. FIGS. 10A and 10B illustrate a structure of a MEMS of this embodiment mode; FIG. 10A is a cross-sectional view of the MEMS; and FIG. 10B is a top plan view of the micro structure. Note that in FIG. 10A, the left side is the cross-sectional view of a first region in which the micro structure is formed and the right side is the cross-sectional view of a second region in which the electric circuit is formed. Cross-sectional views shown in FIGS. 11A to 12C are also similar in this respect. Further, the cross-sectional view taken along a dash-dot line O-P in FIG. 10B corresponds to the cross-sectional view of a micro structure 31 in FIG. 10A. Note that since the micro structure 31 is long in a longitudinal direction, only part of it is shown with a top and a bottom omitted.

In this embodiment mode, the electric circuit 10 and the micro structure 31 are also provided over the same substrate 100 (over the same insulating surface). As shown in FIG. 10B, the micro structure 31 includes a comb-shaped mobile part 321 (a first structural layer), a pair of rectangular first fixed parts 322 (a second structural layer), and wirings 323 and second fixed parts 325 which are connected to the first fixed parts 322. The wirings 323 and the first fixed parts 322 are integrated and are electrically connected to the electric circuit 10. In addition, since the mobile part 321 (the first structural layer) does not move in a direction which is perpendicular to the substrate, the mobile part 321 may include the second fixed parts 325.

The mobile part 321 is a comb-shaped electrode and is formed so as to be separated from the substrate 100. The pair of the first fixed parts 322 is rectangular electrodes and is provided so as to sandwich the mobile part 321. Although the first fixed parts 322 are formed so as to be fixed to the substrate, edges of the first fixed parts 322 which are opposite to the mobile part 321 are separated from the substrate 100. The second fixed parts 325 are formed so as to adhere to the first fixed parts 322. In addition, edges of the second fixed parts 325 are separated from the first fixed parts 322 and overlap with the mobile part 321.

In the micro structure 31, the pair of the first fixed parts 322 is layers which limit their movements so as not to move in a direction which is different from a direction in which the mobile part 321 moves (here, the longitudinal direction of the mobile part).

In this embodiment mode, since the structure of the electric circuit 10 is the same as that of Embodiment Mode 1, a stacked-layer structure of the mobile part 321, the first fixed parts 322, and the wirings 323 are the same as the stacked-layer structure of the first structural layer (the movable electrode 121) and the second structural layer (the fixed electrodes 122 and the wirings 123).

Hereinafter, a method for manufacturing the MEMS of this embodiment mode is described with reference to FIGS. 11A to 13. Note that description which overlaps with Embodiment Mode 1 is omitted and the description of Embodiment Mode 1 is employed.

Figure 11A:
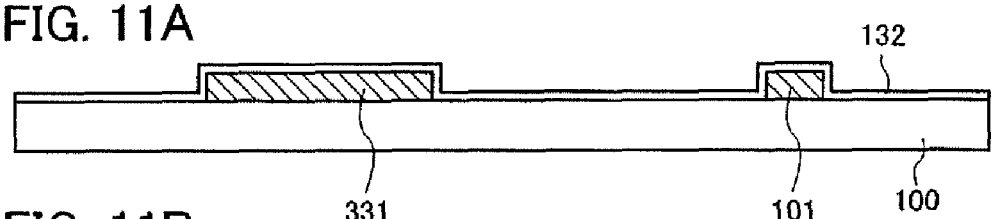
FIGS. 11A to 11E are cross-sectional views showing a method for manufacturing a micro electro mechanical device of the present invention (Embodiment Mode 3)
Figure 13:
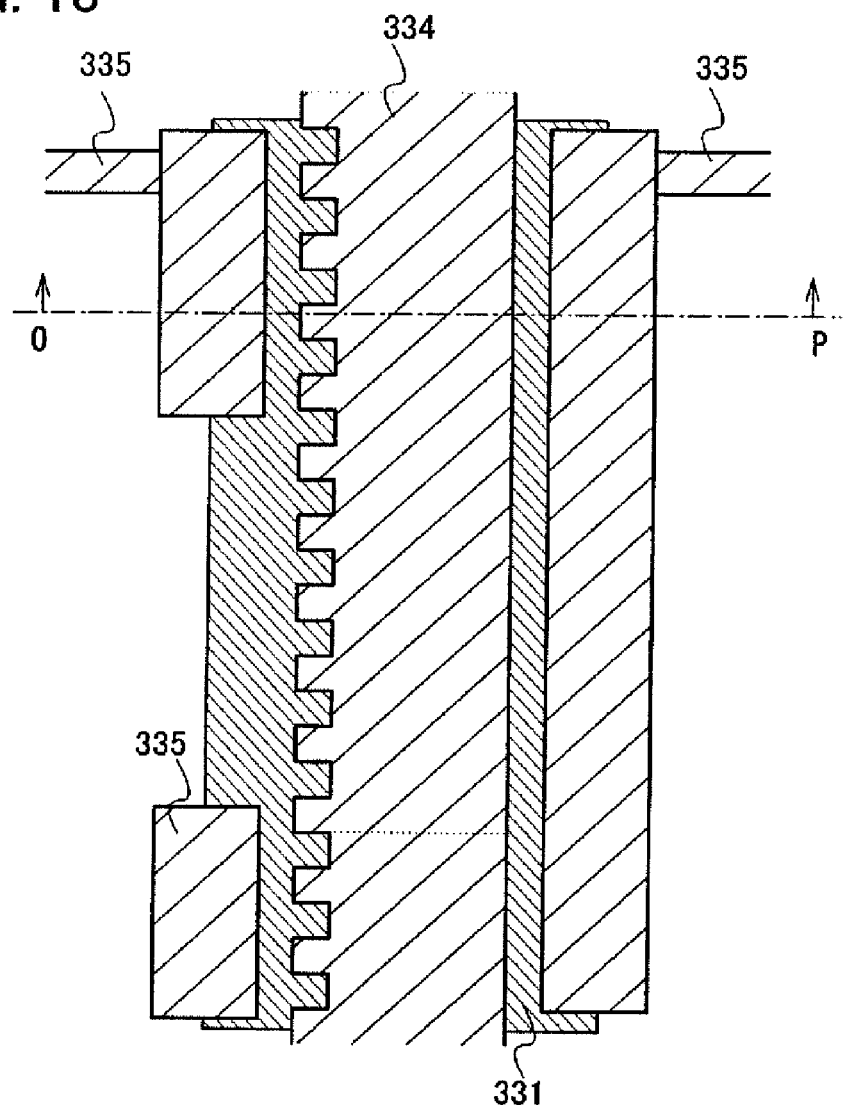
FIG. 13 is a top plan view of a micro structure which is in the middle of manufacturing and is a top plan view of a first conductive layer (a first sacrificial layer) (Embodiment Mode 3)

Similarly to Embodiment Mode 1, a substrate having an insulating surface is prepared as the substrate 100. A conductive film is formed over the substrate 100 and is processed into a predetermined shape by a photolithography process and an etching process, so that the first conductive layer 101 is formed in the second region and a first conductive layer 331 is formed in the first region as shown in FIG. 11A. The first insulating layer 132 is formed over the first conductive layers 101 and 331. The first conductive layer 331 functions as a sacrificial layer (a first sacrificial layer) and is processed into a rectangular shape as shown in FIG. 13. Note that FIG. 13 is a top plan view of the micro structure 31 in FIG. 11C, and a cross section taken along a dash-dot line O-P in FIG. 13 is shown in FIG. 11C.

Figure 11B:
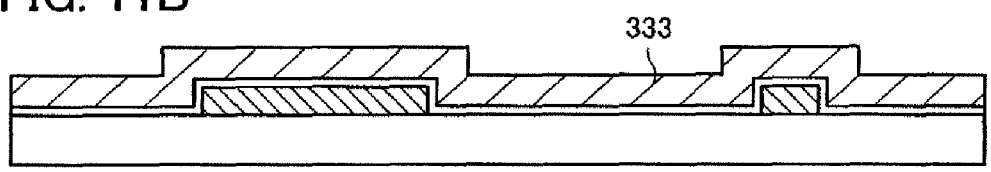

Next, as shown in FIG. 11B, a layer which forms the mobile part 321 and the first fixed parts 322 is formed in the first region and a semiconductor layer 333 which forms the semiconductor layer 103 of a transistor is formed in the second region.

Figure 11C:
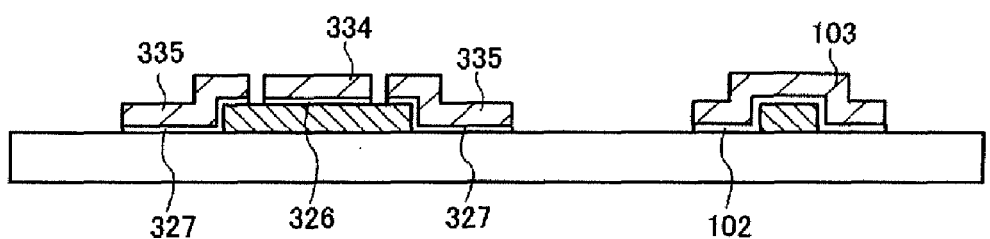

Next, as shown in FIG. 11C, the semiconductor layer 333 and the first insulating layer 132 are processed into predetermined shapes by a photolithography process and an etching process. The semiconductor layer 103 of the transistor is formed from the semiconductor layer 333 in the second region. In addition, a semiconductor layer 334 serving as part of the first structural layer and semiconductor layers 335 serving as parts of the second structural layer are formed in the first region. Further, the first insulating layer 132 is processed into the same shape as each of the semiconductor layers 103, 334, and 335; the first insulating layer 102 serving as a gate insulating film of the transistor is formed in the second region; and insulating layers 326 and 327 are formed in the first region.

By this step, shapes of the first and second structural layers of the micro structure 31 are determined. A layered product of the insulating layer 326 and the semiconductor layer 334 forms the mobile part 321 (the first structural layer), and a layered product of the insulating layer 327 and the semiconductor layer 335 forms the first fixed part 322 and the wiring 323 (the second structural layer). As shown in FIG. 13, the semiconductor layer 334 is formed with a rectangular shape having a comb-shaped portion, and each of the semiconductor layers 335 has a structure in which a rectangular portion serving as the first fixed part 322 and a linear portion serving as the wiring 323 are integrated and is provided so as to sandwich the semiconductor layer 334.

Note that since the mobile part 321 is finally separated from the substrate 100, all of the layered product of the insulating layer 326 and the semiconductor layer 334 is provided over a top surface of the first conductive layer 331. In addition, in order to form a portion which is separated from the substrate 100 on edge of the first fixed part 322 and fix the first fixed part 322 to the substrate 100, an edge of the layered product of the insulating layer 327 and the semiconductor layer 335 is formed so as to cover the top surface and a side surface of the first conductive layer 331, and other parts of the layered product of the insulating layer 327 and the semiconductor layer 335 are formed so as to be in contact with the surface (the insulating surface) of the substrate 100.

Figure 11D:
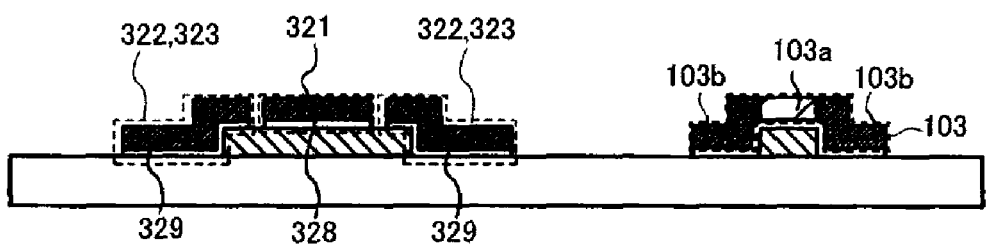

An impurity which imparts n-type or p-type conductivity is selectively added to the semiconductor layers 103, 334, and 335 by doping or ion implantation. In order to selectively add the impurity to portions except for a portion over the first conductive layer 101 serving as a gate electrode, a resist mask is formed over a portion to which the impurity is not added by using photolithography and the impurity is added by using this mask. By this step, as shown in FIG. 11D, the high concentration impurity regions 103b are formed in the semiconductor layer 103 and the region of the semiconductor layer 103 to which the impurity is not added is determined as the channel formation region 103a. The high concentration impurity regions 103b each function as a source region or a drain region. In addition, in the case of not forming a resist mask over the structural layers, the semiconductor layers 334 and 335 which form the structural layers have conductivity by addition of the impurity, so that conductive layers 328 and 329 are formed. Since it is not necessary that the structural layers have conductivity in this embodiment mode, a resist mask is formed over the structural layers so that the impurity is not added to the structural layers.

Figure 11E:
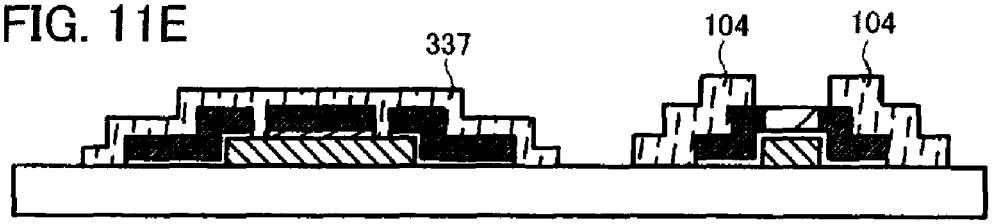

Next, a conductive film is formed by sputtering or the like and is processed by a photolithography process and an etching process, so that the second conductive layers 104 are formed in the second region and a second conductive layer 337 (a second sacrificial layer) is formed in the first region as shown in FIG. 11E. The second conductive layers 104 each function as a source region or a drain region.

The second conductive layer 337 is formed to protect the first and second structural layers from being removed by etching when an opening portion 107 is formed in the second insulating layer 105. Therefore, it is not necessary that the second conductive layer 337 cover all of the structural layer (328 and 329) and it is only necessary that the second conductive layer 337 cover at least a portion of the structural layer (328 and 329) in which the opening portion 107 is formed. In addition, the second conductive layer 337 also functions as a sacrificial layer for forming a gap between the first fixed part 322 and the second fixed part 325.

Alternatively, when it is necessary that the structural layers have conductivity, the second conductive layer 337 is formed of a material including a metal element which can form a metal compound by being reacted with silicon or germanium as described in Embodiment Mode 1, so that each of the conductive layers 328 and 329 can be formed of a metal compound (typically, silicide).

Figure 12A:
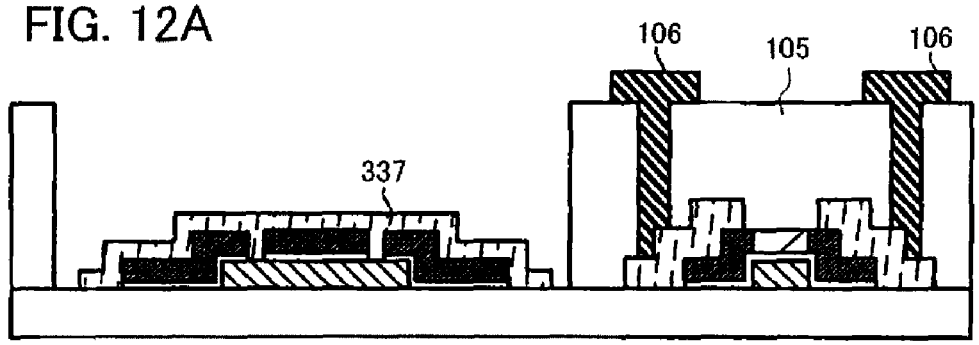
FIGS. 12A to 12C are cross-sectional views showing a method for manufacturing a micro electro mechanical device of the present invention (Embodiment Mode 3)
Figure 12B:
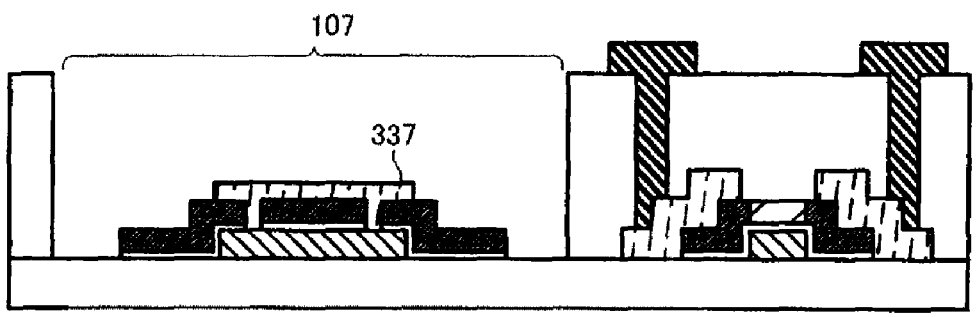

Next, as shown in FIG. 12A, the second insulating layer 105 is formed. A conductive film is formed over the second conductive layers 104 after a contact hole is formed in the second insulating layer 105, and the conductive film is processed into a predetermined shape by a photolithography process and an etching process to form the third conductive layers 106 in the second region. After the third conductive layers 106 are formed, the opening portion 107 is formed in the second insulating layer 105 in the first region by etching as shown in FIG. 12B. Then, the second conductive layer 337 (the second sacrificial layer) and the first conductive layer 331 (the first sacrificial layer) are removed by etching, that is, so-called sacrificial layer etching is performed. The mobile part 321 is not fixed to the substrate 100 when the sacrificial layers (337 and 331) are removed, similarly to the movable electrode of the micro structure in Embodiment Mode 1. Therefore, the opening portion 107 can also be formed so that the second insulating layer 105 is left over the mobile part 321, similarly to Embodiment Mode 1. Further, the second fixed part can also be formed over the mobile part 321. Here, an example of forming the second fixed part is described.

Next, in order to connect the first fixed parts 322 and the second fixed parts 325, the second conductive layer 337 is partially removed by a photolithography process and an etching process (see FIG. 12B).

Figure 12C:
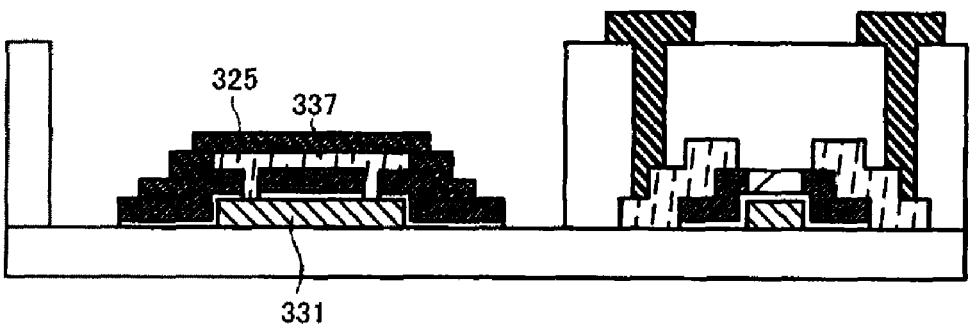

A conductive film is formed over the second conductive layer 237 and is processed into a predetermined shape by a photolithography process and an etching process to form the second fixed parts 325 (the third structural layer) as shown in FIG. 12C. Parts of the second fixed parts 325 are formed so as to be fixed to the first fixed parts 322 and connected to the first fixed parts 322. The edges of the second fixed parts 325 are provided so as to be separated from the first fixed parts 322 and overlap with the mobile part 321.

As a material of each of the second fixed parts 325, a metal such as molybdenum (Mo), tungsten (W), chromium (Cr), tantalum (Ta), titanium (Ti), or aluminum (Al), a metal compound which includes any of these metal elements as a main component (e.g., titanium nitride or tungsten nitride), an alloy which includes any of these metal elements as a main component (e.g., an alloy of aluminum and titanium or an alloy of chromium and molybdenum), or the like can be selected. Alternatively, silicide of a refractory metal such as tungsten, titanium, molybdenum, or tantalum, cobalt, nickel, or the like, crystalline silicon having n-type or p-type conductivity, or the like can also be used. Each of the second fixed parts 325 is a conductive film formed by using a material selected from these conductive materials with a single layer or a multi layer. In addition, when it is not necessary that each of the second fixed parts 325 have conductivity, each of the second fixed parts 325 is formed by using an insulating material with a single layer or a multi layer. Note that a material which cannot be removed by an etching agent used for sacrificial layer etching which removes the first conductive layer 331 and the second conductive layer 337 is used as a material of each of the second fixed parts 325.

Next, the second conductive layer 337 (the second sacrificial layer) and the first conductive layer 331 (the first sacrificial layer) are removed by etching, that is, so-called sacrificial layer etching is performed. When sacrificial layer etching is terminated, the micro structure 31 shown in FIG. 10A is completed.

In this manner, in the present invention, the micro structure having the rotor and the electric circuit can be formed over the same substrate having the insulating surface. Therefore, mechanical intensity of a connection portion of the electric circuit and the micro structure is high so that poor connection is hardly generated. In addition, since there is no step of integrating the micro structure and the electric circuit later, the structure of the MEMS is simplified so that manufacturing cost can be reduced.

Although the mobile part 321 (the first structural layer) has the comb shape in this embodiment mode, it can also be processed into a shape which functions as the rotor or the gear or a shape which functions as the slider. It is only necessary that the first structural layer be processed into a movable shape and the shape of the first structural layer is not limited to the shape of this embodiment mode.

Further, although the electric circuit 10 of Embodiment Mode 1 is used as the structure of the electric circuit in this embodiment mode, the electric circuit 20 of Embodiment Mode 2 can also be used as the structure of the electric circuit. In this case, a stacked-layer structure of the mobile part 321 and the first fixed part 322 (the first and second structural layers) is similar to that of the first and second structural layers (the movable electrode 221 and the fixed electrode 222) of Embodiment Mode 2.

Embodiment Mode 4

In this embodiment mode, a structural example of a micro structure is described. FIG. 14 is an external perspective view of the micro structure of this embodiment mode. Although only the micro structure is shown in FIG. 14, an electric circuit and the micro structure are integrated over a substrate having an insulating surface.

The micro structure includes the first mobile part 421 (a first structural layer) having a gear shape, the second mobile part 422 (a second structural layer) having a cog which engages with the first mobile part 421, and the fixed parts 425 for operating electrostatic force or the like on the second mobile part 422. The fixed parts 425 are electrically connected to the electric circuit which is not shown.

The first mobile part 421 is a gear and is separated from the substrate (the insulating surface) and other structural layers, similarly to the first structural layers of other embodiment modes. The second mobile part 422 is a slider and includes the cog which engages with the first mobile part 421. The second mobile part 422 is also separated from the substrate and other structural layers, similarly to the first structural layer. The first structural layer 421 engages with the second structural layer 422 in this manner, so that a linear movement of the first structural layer 421 can be changed into a rotational movement of the second structural layer 422. On the contrary, the rotational movement of the second structural layer 422 can be changed into the linear movement of the first structural layer 421.

For example, the second structural layer 422 can move linearly by utilizing the fixed parts 425. When electrostatic force is operated on the second mobile part 422 by applying voltage between the fixed parts 425 and the second structural layer 422, the second mobile part 422 moves horizontally like an electrostatic linear motor and the first mobile part 421 rotates. Note that the second mobile part 422 can also be moved by not electrostatic force but electromagnetic force. Such a micro structure can be used as a manipulator which deals with a small cell. Further, the micro structure can be a micro structure which rotates the first mobile part 421 and changes a rotational movement of the first structural layer 421 into a horizontal movement of the second structural layer 422 as shown in Embodiment Modes 1 and 2.

The micro structure shown in FIG. 14 shows an example in which the micro structure is formed by employing the method for manufacturing the MEMS of Embodiment Mode 3. The first to third structural layers (421, 422, and 425) of the micro structure are formed over the substrate 100 at the same time as the electric circuit 10. By changing the shapes of the first to third structural layers (the mobile part 321, the first fixed parts 322, and the second fixed parts 325) and the shapes of the first and second sacrificial layers (the first conductive layer 331 and the second conductive layer 337) in Embodiment Mode 3, the micro structure of this embodiment mode can be manufactured. Therefore, a stacked-layer structure of each structural layer of the micro structure is similar to that of the micro structure 31, which is a stacked layer of an insulating layer and a semiconductor layer.

Further, a structure of the electric circuit can also be the electric circuit 20 of Embodiment Mode 2. In this case, the stacked-layer structure of each of the first to third structural layers (421, 422, and 425) is similar to the stacked-layer structure of each of the first to third structural layers (221, 222, and 225) of Embodiment Mode 2.

Embodiment Mode 5

In this embodiment mode, a technique for making a movable portion of a micro structure smoothly move is described.

The micro structure 11 of Embodiment Mode 1 is described as an example. Although FIG. 1A shows that the movable electrode 121 (the first structural layer) and the substrate 100 are separated in order to easily understand the structure of the micro structure, the movable electrode 121 does not float from the substrate 100 but is in contact with the substrate by gravity after sacrificial layer etching. Therefore, friction between the movable electrode 121 and the insulating surface of the substrate 100 becomes a problem when the movable electrode 121 rotates. In the micro structure of the MEMS of the present invention, a lowest layer of the structural layer which forms the movable portion is formed of the insulating layer (126 or the like). A layer which is in contact with a substrate surface formed of this insulating layer is formed of silicon nitride, silicon oxynitride, or silicon nitride oxide, so that friction can be reduced compared with a structural layer which is not provided with an insulating layer.

By providing a low friction layer such that friction between the movable electrode 121 and the substrate 100 can be reduced over the surface of the substrate 100, an advantageous effect of friction suppression can be further improved. As the low friction layer, a material including silicon such as silicon nitride, silicon nitride oxide, silicon oxynitride, or silicon carbide, or Diamond Like Carbon (DLC) can also be used. Since DLC is minute, it has a high protective function.

Alternatively, the low friction layer can also be selectively formed in the region in which the micro structure 11 is formed even over the entire surface of the substrate 100. The low friction layer can be formed as the insulating surface of the substrate 100 as long as insulating properties are sufficient.

In addition, it is preferable that the low friction layer be provided not only over the surface of the substrate but also in a portion where the structural layers are adjacent to each other by electrostatic force or van der Waals force. For example, when a portion in which the low friction layer is provided is described as for the micro structure 21 of Embodiment Mode 2, the inside of the opening portion 230, a connection portion of the rotation axis 225 and the movable electrode 221, or the like correspond to the portion in the movable electrode 221. Further, in the micro structure 11 of Embodiment Mode 1, a portion in which the movable electrode 121 and the fixed electrode 122 are in contact with each other also corresponds to the portion.

When the layer which forms the micro structure has a shape in which there is a corner seeing from a top surface, it is preferable that the shape be processed by a photolithography process and an etching process so that the corner is rounded. The sacrificial layer is similar in this respect. Since generation of particles can be suppressed by processing into a round shape by removing a corner, a yield can be improved. Further, since stress concentration of the corner is relieved, a defect which is the cause of damage is hardly generated.

Figure 15:
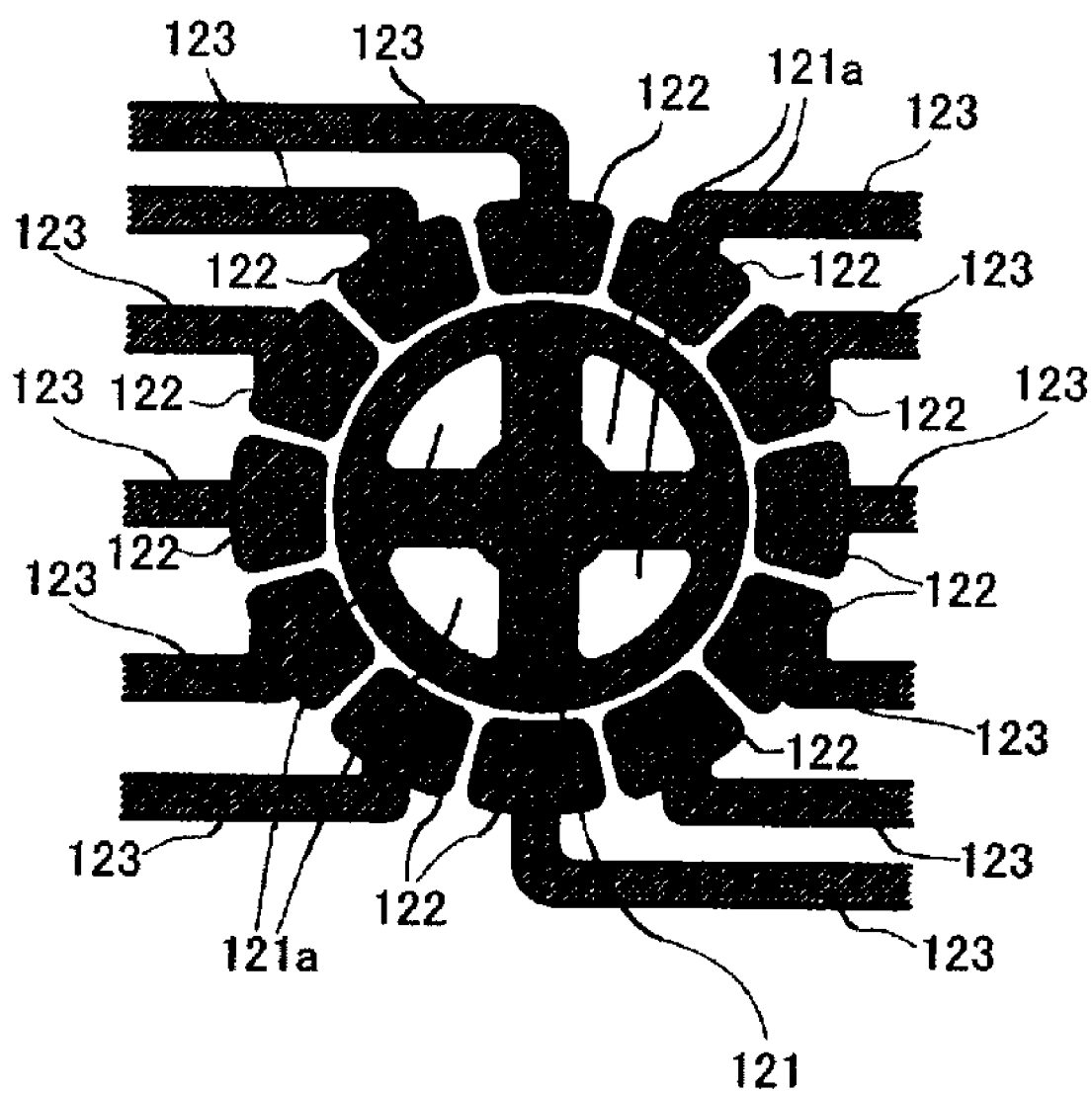
FIG. 15 is a top plan view of a micro structure of the present invention which is processed into a shape such that a corner is rounded (Embodiment Mode 5)

FIG. 15 is a top plan view corresponding to FIG. 1B and shows an example in which the micro structure 11 of Embodiment Mode 1 is processed so that a corner of the structural layer is rounded. Needless to say, each of the micro structures of Embodiment Modes 2 to 4 can also be processed so that a corner of the structural layer is rounded.

Embodiment Mode 6

A micro electro mechanical device of the present invention including a micro structure belongs to a field of micro machines and has a size of a micrometer to a millimeter. In addition, when the micro electro mechanical device of the present invention is manufactured so as to be incorporated as a component of a certain mechanical device, it includes a size of a meter so that it can be easily dealt in incorporation in some cases.

Figure 16:
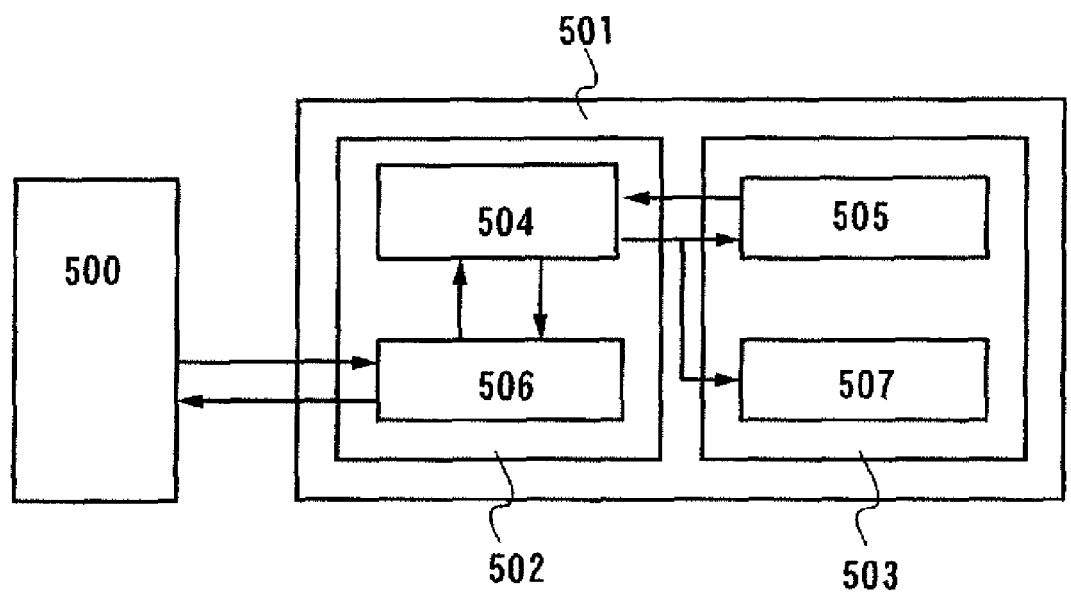
FIG. 16 is a block diagram showing a structural example of a micro electro mechanical device of the present invention (Embodiment Mode 6).

A structural example of the micro electro mechanical device of the present invention including the micro structure is described with reference to FIG. 16. FIG. 16 is a block diagram which shows the structural example of the micro electro mechanical device (the semiconductor device) of the present invention. The micro electro mechanical device of the present invention is not limited to only the structural example in FIG. 16.

A micro electro mechanical device (a MEMS) 501 of the present invention is a device in which an electric circuit portion 502 including a semiconductor element and a structural portion 503 formed of the micro structure are combined. The electric circuit portion 502 includes a control circuit 504 which controls the micro structure, an interface 506 which communicates with an external control device 500, and the like. The structural portion 503 includes a sensor 505, an actuator 507, a switch, or the like depending on the micro structure. An actuator is an element which converts a signal (mainly, an electric signal) into a physical value. An electrostatic motor like those described in Embodiment Modes 1 and 2 can also be provided in the structural portion 503.

In addition, the electric circuit portion 502 can also include a central processing unit for processing data obtained by the structural portion 503, or the like.

In the external control device 500, an operation such as transmitting a signal which controls the micro electro mechanical device 501, receiving data obtained by the micro electro mechanical device 501, or supplying driving power to the micro electro mechanical device 501 is performed.

In addition, in the present invention, the semiconductor element which forms such an electric circuit and the micro structure can be formed over the same insulating surface. By forming over the same insulating surface, a poor connection of the electric circuit or the like and the micro structure can be reduced so that the yield can be improved.

Note that in a conventional method, in the case of dealing with a minute object which is a millimeter or less, a process is necessary in which a structure of the minute object is enlarged so that a human or a computer receives its data, performs data processing, and determines an operation, and then, the operation which is reduced is transmitted to the minute object. However, when only a broader concept instruction is transmitted by the human or the computer, the semiconductor device including the micro structure of the present invention can deal with a minute object. That is, when a purpose is determined and an instruction is transmitted by the human or the computer, the semiconductor device including the micro structure performs data processing by obtaining data on an object using a sensor or the like so that the semiconductor device can take action.

In Embodiment Modes 1 to 5, it is assumed that the objects are minute. For example, it is assumed that weak signals (e.g., slight changes in light or pressure) supplied from the objects, and the like are included although the object themselves have sizes of meters.

As described above, Embodiment Modes 1 to 6 can be combined as appropriate. For example, the shape of the movable electrode 121 shown in Embodiment Mode 1 can be processed into a shape like the movable electrode 221 shown in Embodiment Mode 2. On the contrary, the shape of the movable electrode 221 can be processed into a shape like the movable electrode 121.

Embodiment 1

In this embodiment, an example is described in which structural layers are formed of semiconductor layers having different crystalline structures as described in Embodiment Mode 2 and the like.

As described n Embodiment Mode 2 and the like, for example, silicon layers having different crystalline structures like a polycrystalline silicon layer and an amorphous silicon layer have different mechanical characteristics. Therefore, by stacking the silicon layers, a micro structure which is appropriate for various uses can be manufactured.

<Measurement of Complex Elastic Modulus and Indentation Hardness>

In order to examine difference in mechanical characteristics of silicon layers having different crystalline structures, measurement of complex elastic moduli and indentation hardness of an amorphous silicon layer formed by CVD and a crystalline silicon layer obtained by crystallizing amorphous silicon was performed. Here, the crystalline silicon layer was obtained by laser crystallizing an amorphous silicon layer using a metal element.

The amorphous silicon layer used as a sample was formed as follows. First, a silicon nitride layer having a thickness of 50 nm and a silicon oxide layer having a thickness of 100 nm were formed over a quartz substrate as base layers by CVD. Then, an amorphous silicon layer having a thickness of 66 nm was formed over the base layers by plasma CVD.

In addition, the crystalline silicon layer used as a sample was prepared as follows. An amorphous silicon layer having a thickness of 66 nm was formed by plasma CVD. Nickel was added to the amorphous silicon layer and the amorphous silicon layer was crystallized by using a continuous wave laser. Thickness of the crystalline silicon layer crystallized by laser irradiation was approximately 60 nm. A laser beam used for crystallization was a second harmonic wave of an Nd:YVO$_4$ laser; energy density of the laser was controlled in a range of greater than or equal to 9 W/cm$^2$ and less than or equal to 9.5 W/cm$^2$; and scan speed was set to 35 cm/sec.

Measurement was performed by nano indentation measurement in which a triangular pyramid-shaped indenter was pushed into the sample. A measurement condition was simple indentation and an indenter which was used was a Berkovich indenter made of diamond. Therefore, an elastic modulus of the indenter was approximately 1000 GPa and a Poisson's ratio thereof was approximately 0.1.

A complex elastic modulus which was measured was represented by the following Formula 1 and was an elastic modulus in which an elastic modulus of the sample and the elastic modulus of the indenter were mixed. In Formula 1, Er corresponds to a complex elastic modulus; E corresponds to a Young's modulus; and v corresponds to a Poisson's ratio. In addition, a first term of the formula (a term shown by "sample") is a term to which the elastic modulus of the sample contributes and a second term of the formula (a term shown by "indenter") is a term to which the elastic modulus of the indenter contributes.

[Formula 1]

$$\frac{1}{Er} = \left(\frac{1-v^2}{E}\right)_{sample} + \left(\frac{1-v^2}{E}\right)_{indenter} \quad (1)$$

As shown in Formula 1, the complex elastic modulus can be calculated from the sum of the first term to which the elastic modulus of the sample contributed and the second term to which the elastic modulus of the indenter contributed. However, since the elastic modulus of the indenter was extremely higher than that of the sample, the second term can be ignored and the complex elastic modulus approximately shown the elastic modulus of the sample.

Further, indentation hardness was hardness measured by an indentation method and can be calculated by dividing the maximum indentation weighting by a projection area in maximum indentation. Here, a projection area in indentation can be calculated by a geometric shape of the indenter and a contact depth when the sample was pushed by the indenter.

This indentation hardness was multiplied by 76, so that indentation hardness can be dealt equally to Vickers hardness which was generally used as an index of hardness.

Measurement results of the complex elastic moduli and indentation hardness of the crystalline silicon layer and the amorphous silicon layer are shown in Table 1. Numeric values in Table 1 are an average value of three-times measurement results.

From the results shown in Table 1, crystalline silicon had a higher elastic modulus than that of amorphous silicon. That is, the results showed that crystalline silicon had higher strength for damage by bending than amorphous silicon when force bending a structure was applied. Further, the results showed that crystalline silicon was harder than amorphous silicon.

TABLE 1

| Sample | Complex elastic modulus (GPa) | Indentation hardness (GPa) |
| --- | --- | --- |
| Amorphous silicon | 141 | 15.5 |
| Crystalline silicon | 153 | 20.3 |

By stacking the semiconductor layers having different complex elastic moduli and hardness in this manner, structural layers having both strong flexibility and hardness toward bending force can be manufactured. For example, by stacking the amorphous silicon layer and the crystalline silicon layer used as the sample in this embodiment, damage was hardly spread over amorphous silicon even when damage was generated from a crystal defect of crystalline silicon, so that damage can be prevented from being caused to amorphous silicon. In this manner, balance between flexibility and hardness of the structural layers can be determined depending on a thickness ratio of stacked layers.

This application is based on Japanese Patent Application serial No. 2006-196403 filed in Japan Patent Office on Jul. 19, 2006, the entire contents of which are hereby incorporated by reference.

What is claimed is:

1. A micro electro mechanical device comprising:
a micro structure formed over a substrate having an insulating surface, the micro structure including a first structural layer movable with respect to the substrate and a second structural layer which is partially fixed to the substrate; and
an electric circuit including a transistor electrically connected to the micro structure and formed over the substrate,
wherein the transistor includes a gate insulating layer, a first semiconductor layer in which a channel formation region is formed, and a second semiconductor layer in which an impurity region is formed,
wherein each of the first structural layer and the second structural layer includes an insulating layer, a third semiconductor layer which is in contact with the insulating layer, and a fourth semiconductor layer which is in contact with the third semiconductor layer,
wherein the gate insulating layer and the insulating layer of each of the first structural layer and the second structural layer are patterned portions of a same insulating film formed over the substrate,
wherein the first semiconductor layer and the third semiconductor layer are patterned portions of a same semiconductor film formed over the substrate, and
wherein the second semiconductor layer and the fourth semiconductor layer are patterned portions of a same semiconductor film formed over the substrate.

2. A micro electro mechanical device according to claim 1, wherein the first semiconductor layer and the third semiconductor layer have different crystalline structures.

3. A micro electro mechanical device according to claim 1, wherein the second semiconductor layer and the fourth semiconductor layer have different crystalline structures.

4. A micro electro mechanical device according to claim 1, wherein the third semiconductor layer and the fourth semiconductor layer have different crystalline structures.

5. A micro electro mechanical device according to claim 1, wherein the third semiconductor layer is one of an amorphous semiconductor layer and a microcrystalline semiconductor layer and the fourth semiconductor layer is a polycrystalline semiconductor layer.

6. A micro electro mechanical device according to claim 1, wherein the third semiconductor layer is one of an amorphous semiconductor layer and a microcrystalline semiconductor layer and the fourth semiconductor layer is a crystalline semiconductor layer crystallized by using a metal element.

7. A micro electro mechanical device according to claim 1, wherein each of the third semiconductor layer and the fourth semiconductor layer is a crystalline semiconductor layer and has a different crystalline growth direction.

8. A micro electro mechanical device according to claim 1, wherein each of the third semiconductor layer and the fourth semiconductor layer is a crystalline semiconductor layer crystallized by using a metal element and has a different crystalline growth direction.

9. A micro electro mechanical device comprising:
a micro structure formed over a substrate having an insulating surface, the micro structure including a first structural layer movable with respect to the substrate and a second structural layer which is partially fixed to the substrate; and
an electric circuit including a transistor electrically connected to the micro structure and formed over the substrate,
wherein the transistor includes a gate insulating layer, a first semiconductor layer in which a channel formation region is formed, and a second semiconductor layer in which an impurity region is formed,
wherein each of the first structural layer and the second structural layer includes an insulating layer, a third semiconductor layer which is in contact with the insulating layer, and a conductive layer which is in contact with the third semiconductor layer,
wherein the gate insulating layer and the insulating layer of each of the first structural layer and the second structural layer are patterned portions of a same insulating film formed over the substrate,
wherein the first semiconductor layer and the third semiconductor layer are patterned portions of a same semiconductor film,
wherein the second semiconductor layer and the conductive layer of each of the first structural layer and the second structural layer are patterned portions of a same semiconductor film, and
wherein the conductive layer of each of the first structural layer and the second structural layer includes a compound of a semiconductor and a metal element.

10. A micro electro mechanical device according to claim 9, wherein the third semiconductor layer includes a compound of a semiconductor and a metal element.

11. A micro electro mechanical device comprising:

a micro structure formed over a substrate having an insulating surface, the micro structure including a first structural layer movable with respect to the substrate and a second structural layer which is partially fixed to the substrate; and an electric circuit including a transistor electrically connected to the micro structure and formed over the substrate, wherein the transistor includes a gate insulating layer, a first semiconductor layer in which a channel formation region is formed, and a second semiconductor layer in which an impurity region is formed, wherein each of the first structural layer and the second structural layer includes an insulating layer, a third semiconductor layer which is in contact with the insulating layer, and a conductive layer which is in contact with the third semiconductor layer, wherein the gate insulating layer and the insulating layer of each of the first structural layer and the second structural layer are patterned portions of a same insulating film formed over the substrate, wherein the first semiconductor layer and the third semiconductor layer are patterned portions of a same semiconductor film, wherein the second semiconductor layer and the conductive layer of each of the first structural layer and the second structural layer are patterned portions of a same semiconductor film, and wherein the third semiconductor layer includes a compound of a semiconductor and a metal element.

* * * * *